(12) United States Patent  (10) Patent No.: US 7,812,928 B2
Shiraishi                    (45) Date of Patent:     Oct. 12, 2010

(54) EXPOSURE APPARATUS

(75) Inventor: Masayuki Shiraishi, Kumagaya (JP)

(73) Assignee: Nikon Corporation, Tokyo (JP)

( * ) Notice: Subject to any disclaimer, the term of this patent is extended or adjusted under 35 U.S.C. 154(b) by 913 days.

(21) Appl. No.: 11/478,686

(22) Filed: Jul. 3, 2006

(65) Prior Publication Data

US 2007/0008509 A1 Jan. 11, 2007

Related U.S. Application Data

(60) Provisional application No. 60/724,287, filed on Oct. 7, 2005.

(30) Foreign Application Priority Data

Jul. 6, 2005 (JP) ............................. 2005-197031

(51) Int. Cl.
G03B 27/00 (2006.01)
(52) U.S. Cl. ..................... 355/57; 355/55; 355/67; 355/69
(58) Field of Classification Search .................. 355/53, 355/67, 69, 55, 57; 250/372
See application file for complete search history.

(56) References Cited

U.S. PATENT DOCUMENTS

| 4,773,750 | A | * | 9/1988 | Bruning | ..................... 353/122 |
| 4,922,290 | A | * | 5/1990 | Yoshitake et al. | .............. 355/53 |
| 5,095,190 | A | * | 3/1992 | Aketagawa et al. | ..... 219/121.78 |
| 5,138,176 | A | * | 8/1992 | Nishi | ......................... 250/548 |
| 5,864,386 | A | * | 1/1999 | Nei | .............................. 355/30 |
| 6,549,270 | B1 | * | 4/2003 | Ota | .............................. 355/55 |
| 6,727,980 | B2 | * | 4/2004 | Ota et al. | ....................... 355/55 |
| 2002/0061469 | A1 | | 5/2002 | Tanaka | |
| 2002/0089654 | A1 | * | 7/2002 | Ota et al. | ....................... 355/67 |
| 2003/0142410 | A1 | * | 7/2003 | Miyake | ..................... 359/619 |
| 2004/0106068 | A1 | | 6/2004 | Dierichs | |
| 2005/0045829 | A1 | | 3/2005 | Ito et al. | |
| 2005/0110967 | A1 | * | 5/2005 | Hara et al. | ..................... 355/30 |
| 2006/0082751 | A1 | | 4/2006 | Moors et al. | |

FOREIGN PATENT DOCUMENTS

| JP | 09-036018 | 2/1997 |
| JP | 11-016816 | 1/1999 |
| JP | 2000-131439 | 5/2000 |

* cited by examiner

Primary Examiner—Hung Henry Nguyen
Assistant Examiner—Steven H Whitesell-Gordon
(74) Attorney, Agent, or Firm—Finnegan, Henderson, Farabow, Garrett & Dunner, L.L.P.

(57) ABSTRACT

An exposure apparatus that exposes an object to be exposed with light from an EUV light source. The light has an exposure wavelength component and a non-exposure wavelength component. The exposure apparatus has a detector that independently detects the quantity of light of the exposure wavelength component and the quantity of light of the non-exposure wavelength component of the light. Therefore, for example, even if the quantity of light of the exposure wavelength component and the quantity of light of the non-exposure wavelength component individually fluctuate, it is possible to accurately ascertain fluctuations in the characteristics of the optical system resulting from irradiation heat. As a result, it is also possible to achieve a high performance mirror adjustment system.

16 Claims, 14 Drawing Sheets

EXPOSURE APPARATUS

BACKGROUND

This application claims priority to U.S. provisional patent application No. 60/724,287, filed on Oct. 7, 2005, the contents of which are incorporated herein by reference. This application also claims priority to Japanese patent application no. 2005-197031, filed on Jul. 6, 2005, the contents of which are incorporated herein by reference.

A. Technical Field

The present invention relates to an exposure apparatus applicable to photolithography and particularly to an exposure apparatus for EUVL (EUVL: Extreme UltraViolet Lithography) in which the exposure wavelength is 50 nm or less.

B. Background Art

In common exposure apparatuses, a sensor for monitoring fluctuations in the quantity of light of the exposure light is built in (see Japanese Unexamined Patent Application Publication Nos. H9-36018 and H11-16816, etc.). In particular, Japanese Unexamined Patent Application Publication No. H9-36018 discloses a system (lens adjustment system) that arranges sensors at the upstream side and the downstream side of a projection optical system, estimates the amount of fluctuation in the characteristics of the projection optical system based on the output of those sensors, and adjusts the projection optical system so as to control this. It is preferable that this type of adjustment system also be built into exposure apparatuses for EUVL, which are the next generation of exposure apparatuses.

However, the inventors of the present invention have found that when this adjustment system is applied as-is to an exposure apparatus for EUVL, there is a possibility that the system will not operate properly. The reasons for this include the fact that a special light source for EUVL (EUV light source) is used in the exposure apparatus for EUVL and the fact that a special mirror for reflecting EUV light (multilayer film reflecting mirror) is used. In those cases, it is thought that it would be difficult to estimate the amount of fluctuation of the characteristics of the projection optical system from the fluctuation of the quantity of light of the exposure light.

Therefore, the purpose of the present invention is to provide an exposure apparatus, for example, an exposure apparatus for EUVL, that is able to accurately ascertain fluctuations in the characteristics of the optical system resulting from the irradiation heat of light.

SUMMARY

The disclosed exposure apparatus exposes an object to be exposed with light that has exited from a light source; wherein the exposure apparatus comprises a detector that detects the quantity of light of the non-exposure wavelength component of the light.

Note that it is preferable that the detector independently detects the quantity of light of the exposure wavelength component and the quantity of light of the non-exposure wavelength component of the light.

Also, it is preferable that the exposure apparatus comprises a projection optical system arranged between the light source and the object, and an adjustment system that performs adjustment of the projection optical system based on the output of the detector.

In another embodiment, it is preferable that the projection optical system includes at least one mirror, and at least one of the subjects of adjustment by the adjustment system is the position of the mirror in a direction perpendicular to the optical axis.

In another embodiment, it is preferable that the projection optical system includes at least one mirror, and at least one of the subjects of adjustment by the adjustment system is the attitude of the mirror.

In another embodiment, it is preferable that the projection optical system projects the pattern of a mask to the object, and at least one of the subjects of adjustment by the adjustment system is the relative position of the mask and the object.

In another embodiment, it is preferable that the projection optical system projects the pattern of a mask to the object, and at least one of the subjects of adjustment by the adjustment system is the attitude of at least one of the mask and the object.

Also, it is preferable that the detector independently detects the quantity of light of the exposure wavelength component and the quantity of light of the non-exposure wavelength component of the light, and the adjustment system, in the adjustment, determines the contents of the adjustment of the projection optical system based on the quantity of light of the exposure wavelength component, the quantity of light of the non-exposure wavelength component, characteristics information of the projection optical system with respect to the exposure wavelength component, and characteristics information of the projection optical system with respect to the non-exposure wavelength component.

In another embodiment, it is preferable that there are at least two of the detectors, which are a first detector, which has as its detection subject the light which has not yet passed through the projection optical system, and a second detector, which has as its detection subject the light that has passed through the projection optical system, and the adjustment system corrects the characteristics information of the projection optical system with respect to the exposure wavelength component based on the quantity of light of the exposure wavelength component that the first detector has detected and the quantity of light of the exposure wavelength component that the second detector has detected while also correcting the characteristics information of the projection optical system with respect to the non-exposure wavelength component based on the quantity of light of the non-exposure wavelength component that the first detector has detected and the quantity of light of the non-exposure wavelength component that the second detector has detected.

In another embodiment, it is preferable that the characteristics information of the projection optical system includes the respective absorption coefficients of the respective optical members within the projection optical system.

In another embodiment, it is preferable that the adjustment system considers the reflectivity information of the object with respect to the non-exposure wavelength component in the adjustment contents.

In another embodiment, it is preferable that the exposure apparatus further comprises a reflectivity detector that detects the reflectivity of the object with respect to the non-exposure wavelength component.

In another embodiment, it is preferable that the detector comprise an exposure wavelength sensor that detects the quantity of light of the exposure wavelength component of the light, and a non-exposure wavelength sensor that detects the quantity of light of the non-exposure wavelength component of the light.

In another embodiment, it is preferable that the detector comprise a sensor for specific wavelengths, which detects the quantity of light of the exposure wavelength component or the non-exposure wavelength component of the light, and a sensor for all wavelengths, which detects the quantity of light of all wavelength components of the light.

In another embodiment, it is preferable that the detector comprise a sensor for all wavelengths, which is able to detect the quantity of light of all wavelength components of the light, and a switching mechanism, which switches the wavelength of the incident light with respect to the sensor for all wavelengths between at least two of the exposure wavelength, the non-exposure wavelength and all wavelengths.

In another embodiment, it is preferable that the light source is an EUV light source.

DETAILED DESCRIPTION

The inventors of the present invention have taken into account the circumstances below that are peculiar to exposure apparatuses for EUV.

[1] In addition to EUV light, which is the exposure light (in-band light), surplus ultraviolet light, visible light, infrared light, etc., which are non-exposure light (out-band light), are irradiated from the EUV light source.

[2] The insertion of a filter that cuts out-band light is also being studied, but the insertion location of that filter must be as upstream as possible (upstream from the integrator of the illumination optical system), and in that case, the filter is exposed to a relatively high quantity of EUV light, so durability problems occur.

[3] Multilayer film reflecting mirrors that are widely used in optical systems for EUVL not only reflect in-band light but also reflect out-band light.

[4] There is a strong possibility that the ratio of the quantity of light of the in-band light and the out-band light will fluctuate according to the operating status of the EUV light source.

When these circumstances were taken into account, it was found that it is at least necessary to detect out-band light in order to accurately ascertain fluctuations of the characteristics of the optical system for EUVL.

Therefore, the disclosed exposure apparatus exposes an object to be exposed with light that has exited from a light source. The exposure apparatus comprises a detector that detects the quantity of light of the non-exposure wavelength component of the light.

The first embodiment of the present invention will be explained below while referring to FIG. 1, FIG. 2, FIG. 3, FIG. 4, FIG. 5, FIG. 6, and FIG. 7. This embodiment is an embodiment of a projection exposure apparatus for EUVL.

First, the configuration of this projection exposure apparatus will be explained.

Figure 1:
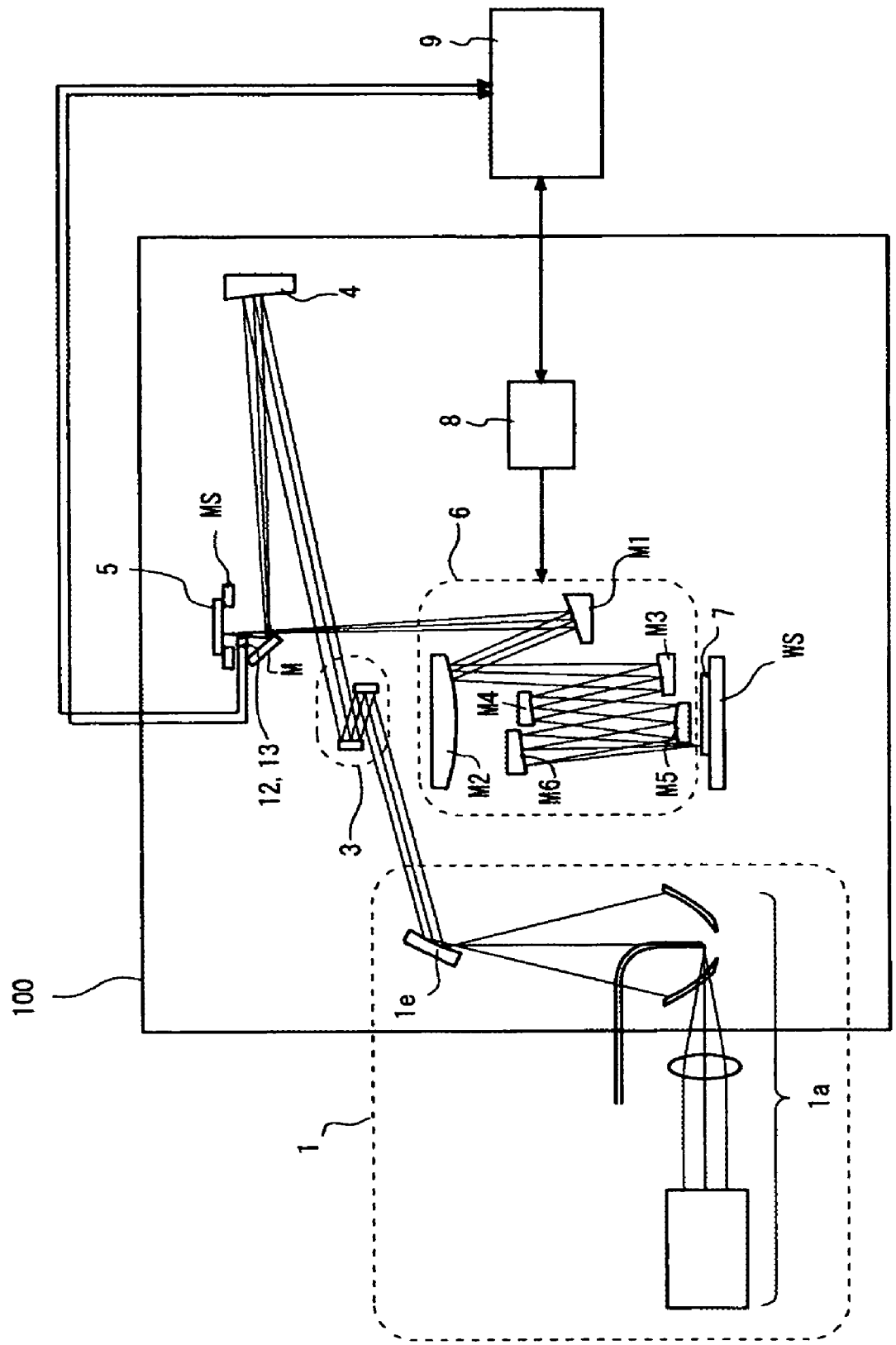
FIG. 1 is a schematic block diagram of a projection exposure apparatus of the first embodiment.

FIG. 1 is a schematic block diagram of this projection exposure apparatus. As shown in FIG. 1, arranged in this projection exposure apparatus are an irradiation apparatus 1, a reflecting type integrator 3, a condenser mirror 4, an optical path bending mirror M, a reflecting type reticle 5, a reticle stage MS, a reflecting type projection optical system 6, an object 7 to be exposed (for example, a wafer), a wafer stage WS, a mirror adjustment mechanism 8, and light quantity sensors 12, 13. The respective drive components thereof are connected to a controller 9 comprised of a circuit, a computer, or the like. Incidentally, code 100 in FIG. 1 is a vacuum chamber for maintaining a vacuum for the entirety of the optical path of this projection exposure apparatus.

The irradiation apparatus 1 comprises a laser plasma light source 1a, which is one type of EUV light source, and a collimator mirror 1e. EUV light with a wavelength of 13.5 nm, which is in-band light, and out-band light with other wavelengths exits from the laser plasma light source 1a.

The light that has exited from the laser plasma light source 1a evenly illuminates the region to be illuminated of the reticle 5 after sequentially passing through the collimator mirror 1e, the integrator 3, the condenser mirror 4, and the optical path bending mirror M. The light that has been reflected by the region to the illuminated of the reticle 5 is incident to the projection optical system 6.

A plurality of mirrors, for example, six mirrors M1, M2, M3, M4, M5, M6, are arranged in the projection optical system 6. The light that has been reflected by mirrors M1, M2, M3, M4, M5 and M6 forms a reduced image of the reticle 5 on the wafer 7. This reduced image is a reduced image of the pattern formed within the region to be illuminated of the reticle 5. Through this reduced image, the region to be exposed of the surface of the wafer 7 is exposed.

The intervals of mirrors M1, M2, M3, M4, M5, and M6 within the projection optical system 6 (positions of the respective mirrors in the optical axis direction) can be adjusted by a mirror adjustment mechanism 8. The instruction for that adjustment and the amount of adjustment (the amount of adjustment of the respective mirrors in the optical axis direction) are provided from the controller 9 to the mirror adjustment mechanism 8. Through this, it is possible to adjust the image formation characteristics of the projection optical system 6.

Here, characteristics for reflecting in-band light (here, EUV light with a wavelength of 13.5 nm) are assigned to the respective optical systems within this projection exposure apparatus. In particular, the respective mirrors within the integrator 3, the condenser mirror 4, the optical path bending mirror M, and the respective mirrors M1, M2, M3, M4, M5, M6 within the projection optical system 6 shown in FIG. 1 are direct incidence type mirrors whose angle of incidence of light is smaller than 45', so a multilayer film is formed on the reflecting surfaces thereof. The configuration of the multilayer film is such that two or more substances from among such substances as molybdenum (Mo), silicon (Si), ruthenium (Ru), rhodium (Rh) and silicon oxide have been laminated. The reflectivity of mirrors on which such a multilayer film has been formed is approximately 60~70% with respect to in-band light and approximately 80% with respect to out-band light.

Next, the light quantity sensors 12, 13 will be explained in detail.

Figure 2:
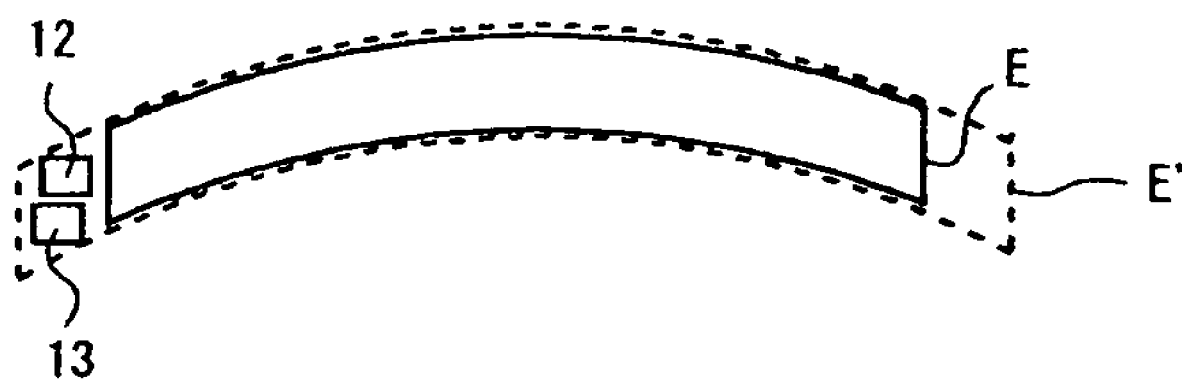
FIG. 2 is a drawing that describes the arrangement locations of light quantity sensors 12 and 13 in detail.

As shown within FIG. 1, the arrangement locations of the light quantity sensors 12, 13 are within the light beam that illuminates the reticle 5. That arrangement location is shown in detail in FIG. 2. In FIG. 2, code E' indicates the region to be illuminated of the reticle 5 and code E indicates the transfer region of the reticle 5 (transfer region refers to the region projected onto the wafer 7). Of this, the region to be illuminated E' covers the entirety of the transfer region E and is somewhat larger than that transfer region E. The light quantity sensors 12, 13 are arranged within the light beam that illuminates the region to be illuminated E' and within the light beam incident to the exterior of the transfer region E. The light quantity sensors 12, 13 arranged in these locations are able to monitor the quantity of light of those light beams without affecting the light beam going to the wafer 7.

Figure 3A:
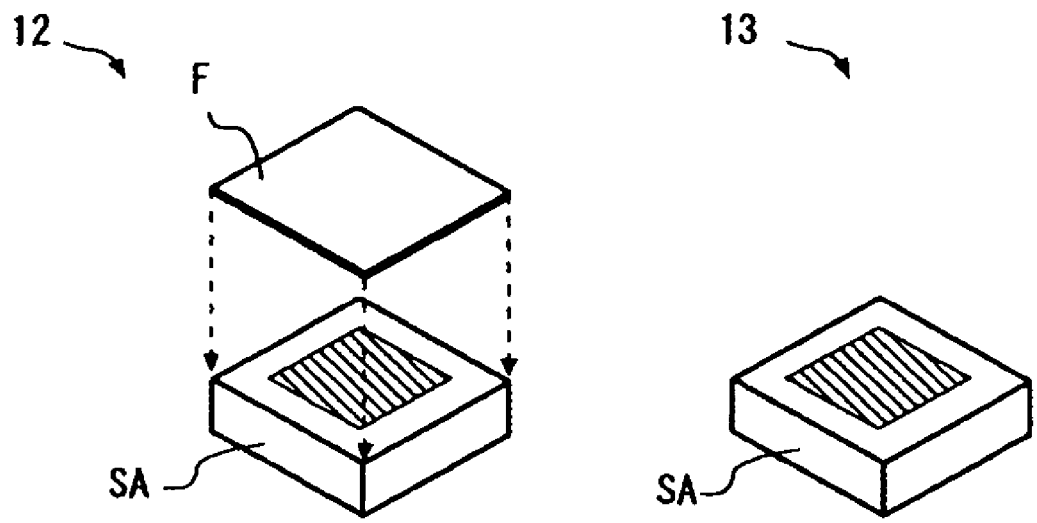
FIG. 3(a) is a drawing that explains the configuration of light quantity sensors 12 and 13 as well.

FIG. 3(a) is a drawing that explains the configuration of the light quantity sensors 12, 13, and FIG. 3(b) shows the detected wavelength band.

First, as shown on the left side of FIG. 3(a), light quantity sensor 12 has a wavelength selection filter F on a photoelectric conversion element SA. The photoelectric conversion element SA is a photoelectric conversion element comprising a silicon photodiode, etc. and that is sensitive to light in an adequately broad wavelength band. The wavelength band sensed by the photoelectric conversion element SA covers the wavelength band of in-band light (here, 13.5 nm) and the wavelength band of out-band light. In addition, the wavelength selection filter F is comprised of zirconium or silicon, etc., has transmittivity only with respect to in-band light, and cuts out-band light. Therefore, light quantity sensor 12 is able to detect the individual quantity of light of the in-band light. The detection band of this light quantity sensor 12 is as shown by code $E_{12}$ in FIG. 3(b) for example. Incidentally, the curve in FIG. 3(b) is an example of the light emission spectrum of the laser plasma light source 1a, and, in actuality, is not limited to becoming as in this curve and also fluctuates according to the operating status of the laser plasma light source 1a.

In addition, as shown at the right side of FIG. 3(a), light quantity sensor 13 comprises a photoelectric conversion element SA with the same characteristics as those used in light quantity sensor 12. Therefore, light quantity sensor 13 detects the quantity of light of the sum of the out-band light and the in-band light. The detection band of this light quantity sensor 13 is as indicated by code $E_{13}$ in FIG. 3(b) for example.

Next, the mirror adjustment system of this projection exposure apparatus will be explained.

Figure 4:
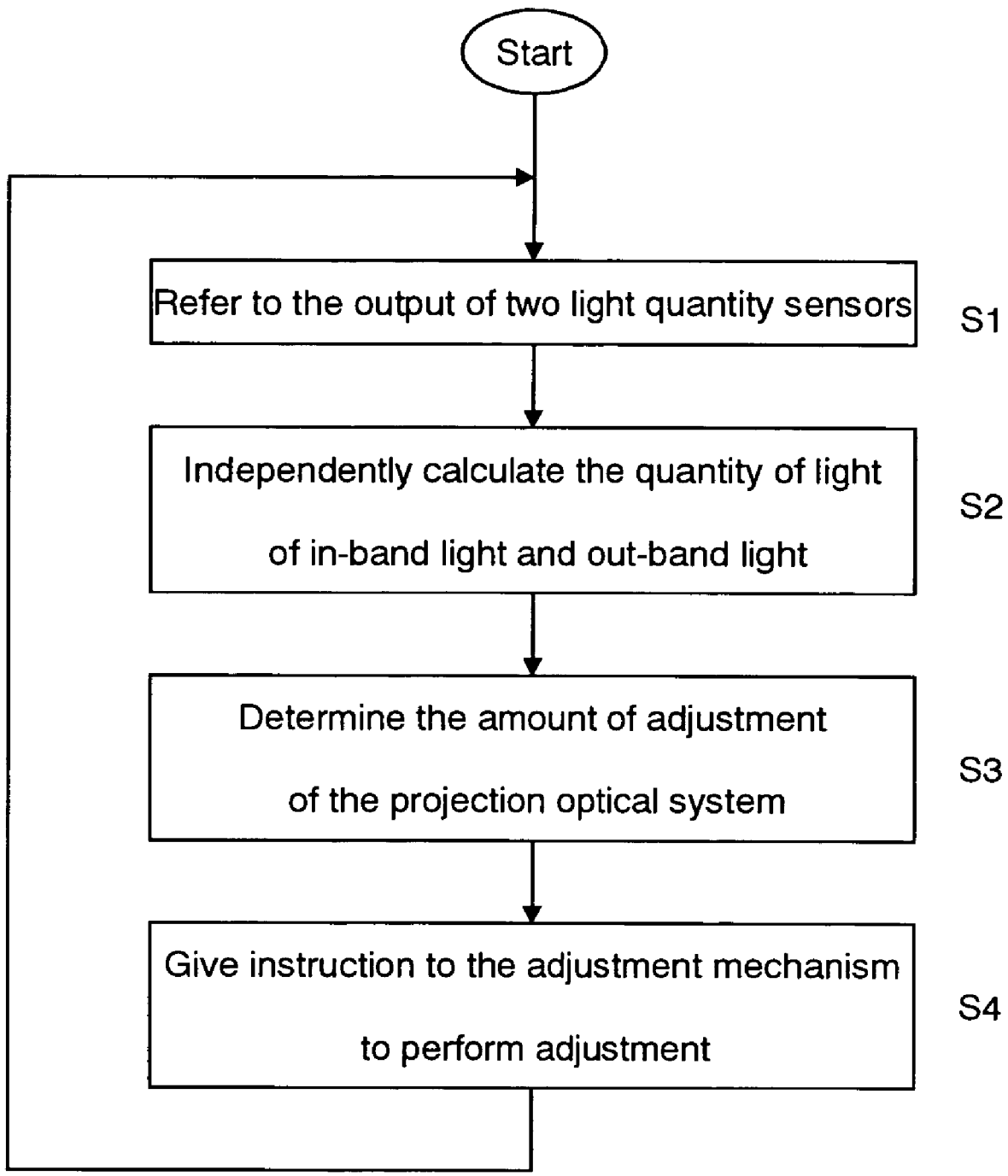
FIG. 4 is an operation flowchart of the controller 9 relating to the mirror adjustment system.

FIG. 4 is in operation flowchart of the controller 9 related to the mirror adjustment system. Note that, in FIG. 4, this is expressed without distinguishing between operation of the circuit portion and operation of the computer portion of the controller 9.

As shown in FIG. 4, the controller 9 refers to the output of the light quantity sensors 12, 13 (step S1), independently calculates the quantity of light of the in-band light and the quantity of light of the out-band light incident to the projection optical system 6 (step S2) based on those outputs, determines the amount of adjustment of the projection optical system 6 (here, the amount of adjustment of the respective mirrors in the optical axis direction) based on the respective calculated quantities of light (step S3), and performs adjustment of the projection optical system 6 by providing the adjustment instruction and the amount of adjustment (here, the amount of adjustment of the respective mirrors in the optical axis direction) to the mirror adjustment mechanism 8 (step S4). Note that these steps S1~S4 are repeatedly executed during the exposure period. Steps S2 and S3 will be explained in detail below.

Figure 5A:
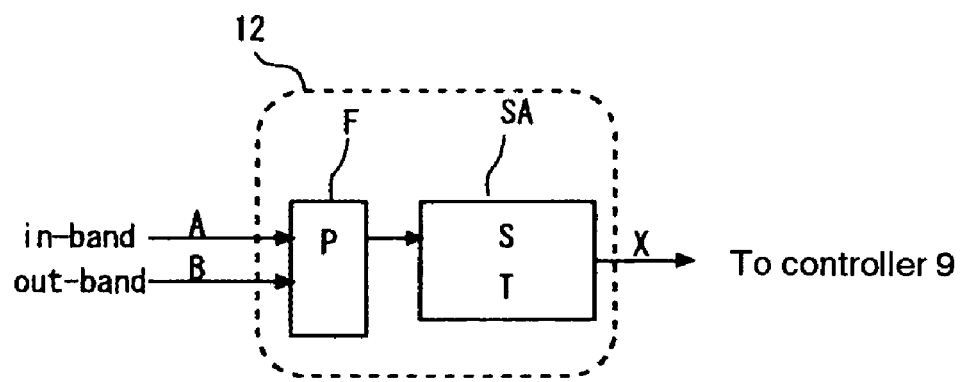
FIG. 5(a), FIG. 5(b), and FIG. 5(c) are drawings that explain step S2.
Figure 5B:
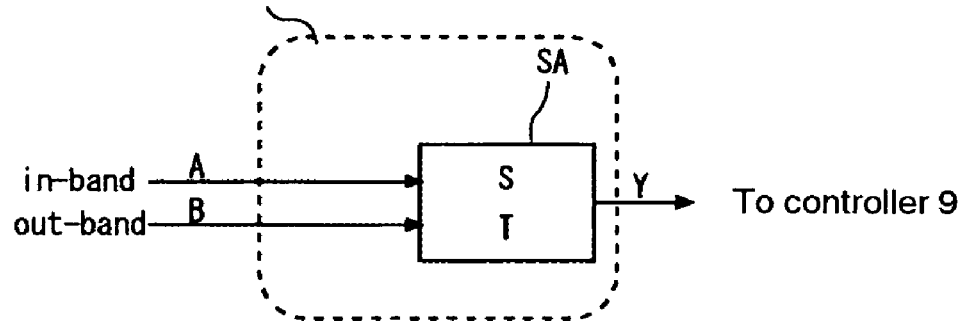

Step S2 is explained first. As shown in FIGS. 5(a) and 5(b), the quantity of light of the in-band light that was incident to light quantity sensors 12 and 13 is A, and the quantity of light of the out-band light is B. In addition, the transmittivity of the wavelength selection filter F inside light quantity sensor 12 is P, the sensitivity coefficient (conversion efficiency) of the photoelectric conversion element SA with respect to in-band light is S, and the sensitivity coefficient (conversion efficiency) of the photoelectric conversion element SA with respect to out-band light is T.

At this time, in light quantity sensor 12, as shown in FIG. 5(a), the in-band light of quantity of light A is incident to the photoelectric conversion element SA after being attenuated by the transmittivity P of the wavelength selection filter F and is converted to electrical signals at a conversion efficiency S. On the other hand, the out-band light of quantity of light B incident to light quantity sensor 12 is cut by the wavelength selection filter F. Therefore, the output X of light quantity sensor 12 is expressed by X=A×P×S.

In addition, in light quantity sensor 13, as shown in FIG. 5(b), both the in-band light of quantity of light A and the out-band light of quantity of light B are incident to the photoelectric conversion element SA without any attenuation being performed. Of these, the in-band light is converted to electrical signals at conversion efficiency S, and the out-band light is converted to electrical signals at conversion efficiency T. Therefore, the output Y of light quantity sensor 13 is expressed by Y=A×S+B×T.

Equation (1) below is established based on the above.

Equation 1

$$\begin{pmatrix} X \\ Y \end{pmatrix} = \begin{pmatrix} APS \\ AS + BT \end{pmatrix} = \begin{pmatrix} PS & 0 \\ S & T \end{pmatrix} \begin{pmatrix} A \\ B \end{pmatrix} \quad (1)$$

Therefore, the controller 9 independently calculates quantity of light A of the in-band light and quantity of light B of the out-band light by applying output X of light quantity sensor 12 and output Y of light quantity sensor 13 to Equation (2) below. The information required for this calculation, that is, information relating to characteristics of light quantity sensors 12 and 13, such as "A," "P," "S" and "T," is stored in advance by the controller 9.

Equation 2

$$\begin{pmatrix} A \\ B \end{pmatrix} = \begin{pmatrix} PS & 0 \\ S & T \end{pmatrix}^{-1} \begin{pmatrix} X \\ Y \end{pmatrix} \quad (2)$$

Note that calculated quantities of light A and B indicate the quantities of light of the in-band light and out-band light incident to light quantity sensors 12 and 13, so they are equivalent to the quantities of light of the in-band light and the out-band light incident to the reticle 5.

Figure 5C:
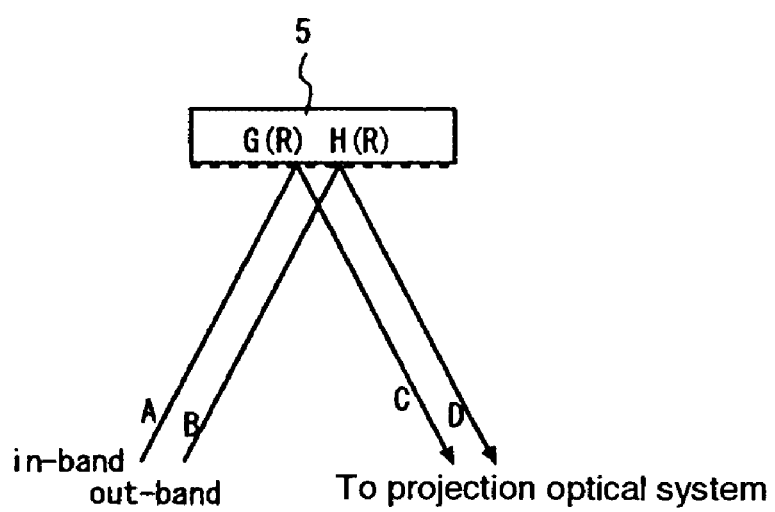

Next, as shown in FIG. 5(c), when the reflection coefficient of the reticle 5 with respect to in-band light is G[R], and the reflection coefficient of the reticle 5 with respect to out-band light is H[R], quantity of light C of the in-band light incident to the projection optical system 6 is expressed by C=A×G[R], and quantity of light D of the out-band light incident to the projection optical system 6 is expressed by D=B×H[R]. Specifically, Equation (3) below is established.

Equation 3

$$\begin{cases} C = A \times G[R] \\ D = B \times H[R] \end{cases} \quad (3)$$

Note that reflection coefficients G[R] and H[R] are coefficients that are determined for each reticle ("R" indicates that it is a reticle coefficient).

Therefore, the controller 9 independently estimates quantity of light C of the in-band light that is incident to the projection optical system 6 and quantity of light D of the out-band light that is incident to the projection optical system 6 by applying quantities of light A and B to Equation (3) above.

Note that the information required for this estimation, that is, information relating to the "G[R]" and "H[R]" characteristics of the reticle 5, is stored by the controller 9 in advance.

Figure 6:
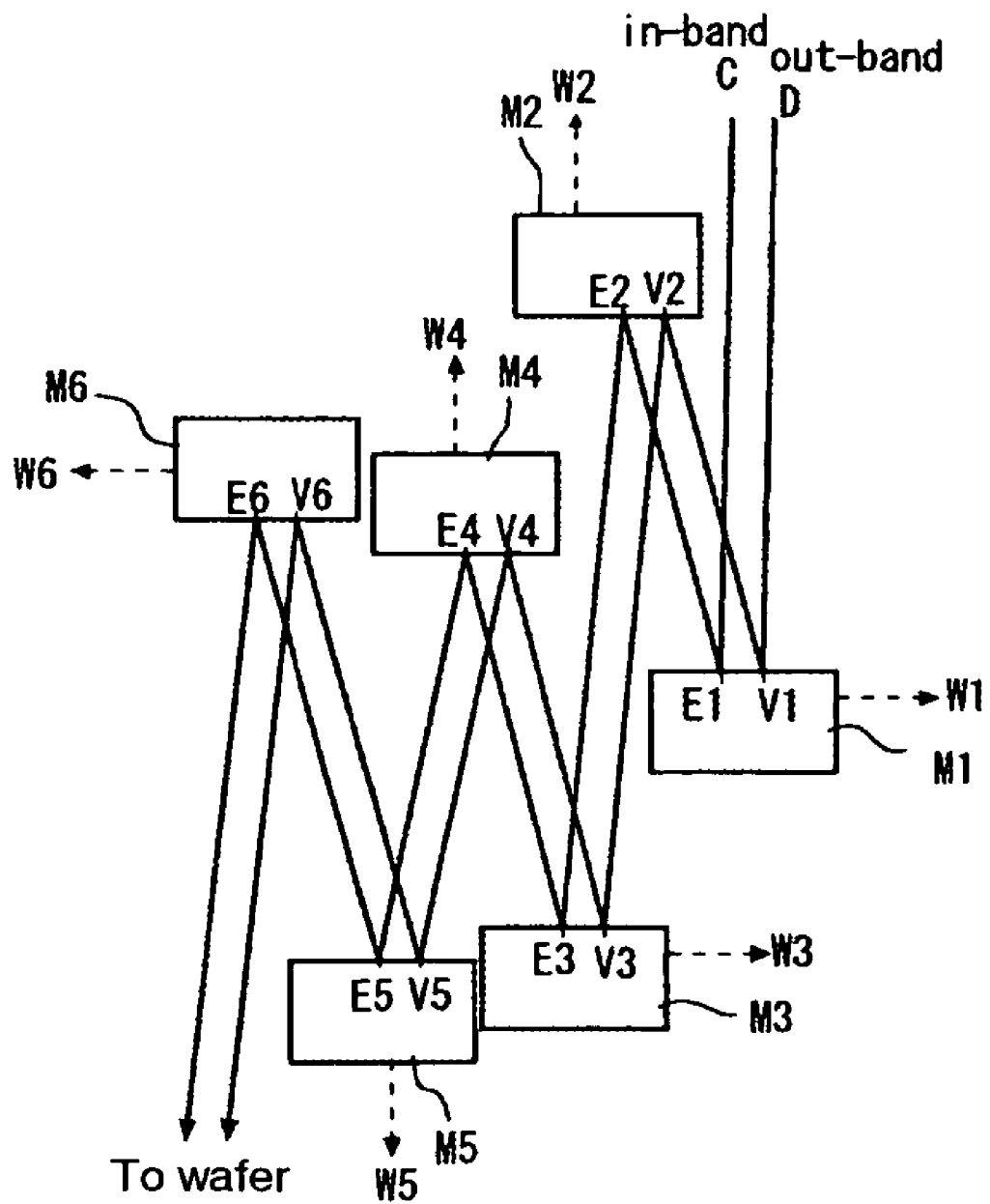
FIG. 6 is a drawing that explains step S3.

Now, Step S3 is explained. As shown in FIG. 6, the heat absorption coefficient of a mirror Mi within the projection optical system 6 with respect to in-band light is Ei, and the heat absorption coefficient of a mirror Mi with respect to out-band light is Vi. However, heat absorption coefficient Ei is the amount of heat (amount of heat absorption) absorbed by a mirror Mi caused by the in-band light when the quantity of light of the in-band light incident to the projection optical system 6 was "1," and heat absorption coefficient Vi is the amount of heat (amount of heat absorption) absorbed by a mirror Mi caused by out-band light when the quantity of light of the out-band light incident to the projection optical system 6 was "1." Note that, in this specification, "amount of heat absorption of the mirror" indicates "the quantity of light of the light that is changed to heat by a mirror" and is expressed in light energy per unit time.

At this time, if the quantity of light of the in-band light incident to the projection optical system 6 is C, the amount of heat wi absorbed by a mirror Mi caused by the in-band light is expressed by wi=C×Ei.

In addition, if the quantity of light of the out-band light incident to the projection optical system 6 is D, the amount of heat wi' absorbed by a mirror Mi caused by the out-band light is expressed by wi'=D×Vi.

Therefore, the sum of the amount of heat wi absorbed by a mirror Mi caused by the in-band light and the amount of heat wi' absorbed by a mirror Mi caused by the out-band light is the total amount of heat Wi absorbed by a mirror Mi.

Therefore, the controller 9 estimates the respective amounts of heat W1, W2, W3, W4, W5, W6 absorbed by the mirrors M1, M2, M3, M4, M5, M6 by applying the quantity of light C of the in-band light and the quantity of light D of the out-band light incident to the projection optical system 6 to Equation (4) below.

Equation 4

$$W_i = (C\ D)\begin{pmatrix} E_i \\ V_i \end{pmatrix} \quad (4)$$

Note that the information required for this estimation, that is, information relating to the "E1," "E2," "E3," "E4," "E5," "E6," "V1," "V2," "V3," "V4," "V5," and "V6" characteristics of mirrors M1, M2, M3, M4, M5, and M6 are stored in advance by the controller 9. Incidentally, heat absorption coefficient Ei of a mirror Mi is determined according to the reflectivity of a mirror Mi and mirrors further on the upstream side thereof with respect to in-band light, and heat absorption coefficient Vi of a mirror Mi is determined according to the reflectivity of a mirror Mi and mirrors further upstream thereof with respect to out-band light.

Moreover, the controller 9 calculates the deformation rate P1 of mirror M1 at this time based on the amount of heat absorption W1 of mirror M1 and the history of that amount of heat absorption (Calculation of deformation rate P1 is possible if it is based on, at least, the amount of heat absorption W1 of mirror M1 and the previous value of that amount of heat absorption. However, the contents of that calculation are determined by a time constant of the heat balance peculiar to mirror M1.). Note that the amount of deformation that is the reference of deformation rate P1 is the amount of deformation when the quantity of light C of the in-band light and the quantity of light D of the out-band light respectively continue to be maintained at the reference value, and mirror M1 has reached a steady state.

Similarly, the controller 9 calculates the deformation rate P2 of mirror M2 at this time based on the amount of heat absorption W2 of mirror M2 and the history of that amount of heat absorption (Calculation of deformation rate P2 is possible if it is based on, at least, the amount of heat absorption W2 of mirror M2 and the previous value of that amount of heat absorption. However, the contents of that calculation are determined by a time constant of the heat balance peculiar to mirror M2.). Note that the amount of deformation that is the reference of deformation rate P2 is the amount of deformation when the quantity of light C of the in-band light and the quantity of light D of the out-band light respectively continue to be maintained at the reference value, and mirror M2 has reached a steady state.

Similarly, the controller 9 calculates the deformation rate P3 of mirror M3 at this time based on the amount of heat absorption W3 of mirror M3 and the history of that amount of heat absorption (Calculation of deformation rate P3 is possible if it is based on, at least, the amount of heat absorption W3 of mirror M3 and the previous value of that amount of heat absorption. However, the contents of that calculation are determined by a time constant of the heat balance peculiar to mirror M3.). Note that the amount of deformation that is the reference of deformation rate P3 is the amount of deformation when the quantity of light C of the in-band light and the quantity of light D of the out-band light respectively continue to be maintained at the reference value, and mirror M3 has reached a steady state.

Similarly, the controller 9 calculates the deformation rate P4 of mirror M4 at this time based on the amount of heat absorption W4 of mirror M4 and the history of that amount of heat absorption (Calculation of deformation rate P4 is possible if it is based on, at least, the amount of heat absorption W4 of mirror M4 and the previous value of that amount of heat absorption. However, the contents of that calculation are determined by a time constant of the heat balance peculiar to mirror M4.). Note that the amount of deformation that is the reference of deformation rate P4 is the amount of deformation when the quantity of light C of the in-band light and the quantity of light D of the out-band light respectively continue to be maintained at the reference value, and mirror M4 has reached a steady state.

Similarly, the controller 9 calculates the deformation rate P5 of mirror M5 at this time based on the amount of heat absorption W5 of mirror M5 and the history of that amount of heat absorption (Calculation of deformation rate P5 is possible if it is based on, at least, the amount of heat absorption W5 of mirror M5 and the previous value of that amount of heat absorption. However, the contents of that calculation are determined by a time constant of the heat balance peculiar to mirror M5.). Note that the amount of deformation that is the reference of deformation rate P5 is the amount of deformation when the quantity of light C of the in-band light and the quantity of light D of the out-band light respectively continue to be maintained at the reference value, and mirror M5 has reached a steady state.

Similarly, the controller 9 calculates the deformation rate P6 of mirror M6 at this time based on the amount of heat absorption W6 of mirror M6 and the history of that amount of heat absorption (Calculation of deformation rate P6 is possible if it is based on, at least, the amount of heat absorption W6 of mirror M6 and the previous value of that amount of heat absorption. However, the contents of that calculation are determined by a time constant of the heat balance peculiar to mirror M6.). Note that the amount of deformation that is the reference of deformation rate P6 is the amount of deformation when the quantity of light C of the in-band light and the quantity of light D of the out-band light respectively continue to be maintained at the reference value, and mirror M6 has reached a steady state.

As indicated above, if the deformation rates P1, P2, P3, P4, P5, and P6 of mirrors M1, M2, M3, M4, M5, and M6 are respectively known, the amount of fluctuation that occurs in the image formation characteristics of the projection optical system 6 at this time can be known.

In addition, the controller 9 determines the amount of adjustment (amounts of adjustment $Z_1$, $Z_2$, $Z_3$, $Z_4$, $Z_5$, and $Z_6$ of mirrors M1, M2, M3, M4, M5, and M6) of the projection optical system 6 required to control fluctuation of the image information characteristics based on deformation rates P1, P2, P3, P4, P5, and P6 of the respective mirrors.

Figure 3:
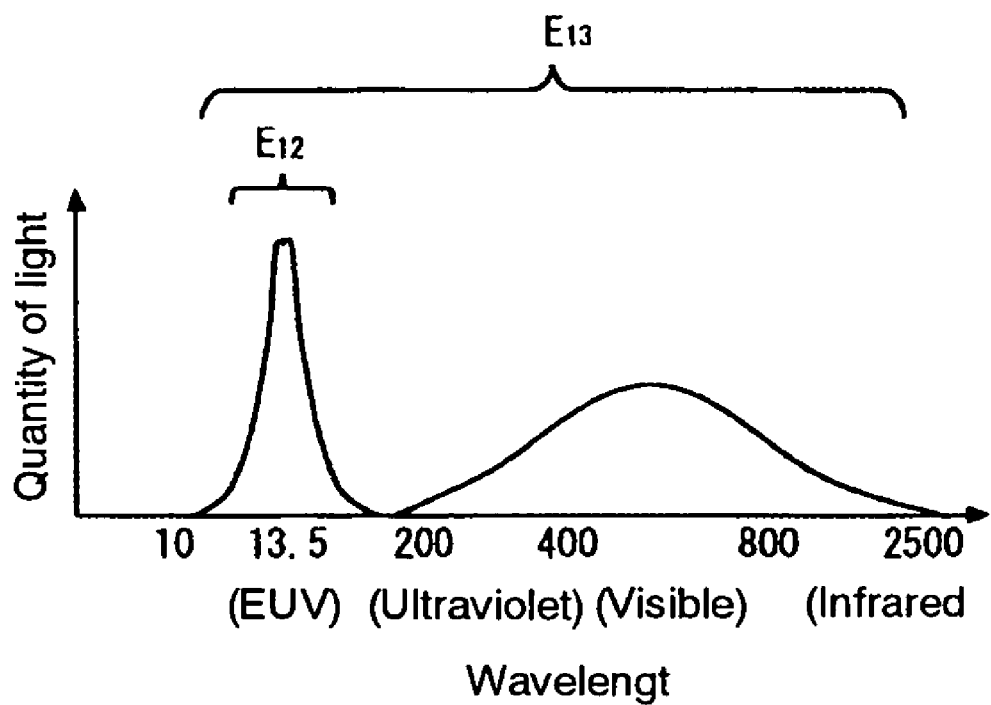
FIG. 3(b) shows the detection wavelength bands.

In the above, this projection exposure apparatus comprises sensor parts (light quantity sensors 12 and 13) for independently detecting the quantity of light of the in-band light and the quantity of light of the out-band light (see FIG. 2 and FIG. 3). Furthermore, the controller 9 estimates the amount of fluctuation of the image formation characteristics of the projection optical system 6 resulting from the irradiation heat of the light based on two types of detected quantities of light.

Therefore, provisionally, even if the quantity of light of the in-band light and the quantity of light of the out-band light were to have individually fluctuated, the amount of fluctuation of the image formation characteristics of the projection optical system 6 would be correctly estimated. As a result, the amount of adjustment of the projection optical system 6 would become an appropriate value, and the mirror adjustment system would operate correctly.

Moreover, the controller 9 independently estimates the amount of heat absorbed by the projection optical system 6 caused by the in-band light and the amount of heat absorbed by the projection optical system 6 caused by the out-band light based on two types of detected quantities of light, and the sum of these amounts of heat is considered to be the total amount of heat absorbed by the projection optical system 6 (see Equation (1)~Equation (4)). Therefore, the aforementioned amount of fluctuation is estimated with high accuracy.

In addition, the sensor parts of this projection exposure apparatus comprise a photoelectric conversion element SA, which is an ordinary optical element, and a wavelength selection filter F (see FIG. 3(a)) and are therefore extremely simple.

Note that, in this projection exposure apparatus, in the case where a reticle blind is arranged at the front part of the reticle 5 shown in FIG. 1, the light quantity sensors 12 and 13 may be provided on the plane of the incidence side of that reticle blind.

In addition, the arrangement locations of the light quantity sensors 12, 13 may be other locations, such as the optical path between the projection optical system 6 and reticle 5 and the optical path inside the projection optical system 6. However, it is preferable that the arrangement be upstream of the aperture member (not shown in the drawing) inside the projection optical system 6 and in the optical path of a light ray that does not pass through that aperture member so that the exposure operation of this projection exposure apparatus is not affected. For example, the arrangement locations of light quantity sensors 12 and 13 may be on the plane of the incidence side of the aperture member inside the projection optical system 6.

In addition, an exposure amount control system that uses the output of light quantity sensor 12 (=output that indicates the quantity of light of the in-band light) may be built into this projection exposure apparatus. That exposure control system is such that the power of the laser plasma light source 1a is feedback controlled so that the output value of light quantity sensor 12 and the time integrated value of the output of light quantity sensor 12 are maintained at values determined in advance.

Also, in addition to a laser plasma light source 1a, other EUV light sources such as discharge plasma light sources and synchrotron light sources may be used as the light source of this projection exposure apparatus.

If the mirror adjustment mechanism 8 of this projection exposure apparatus is able to adjust the image formation characteristics of the projection optical system 6, it may, in addition to one that adjusts the respective positions of mirrors M1, M2, M3, M4, M5 and M6, also be one that adjusts the pressure of the media between mirrors M1, M2, M3, M4, M5 and M6.

Figure 7:
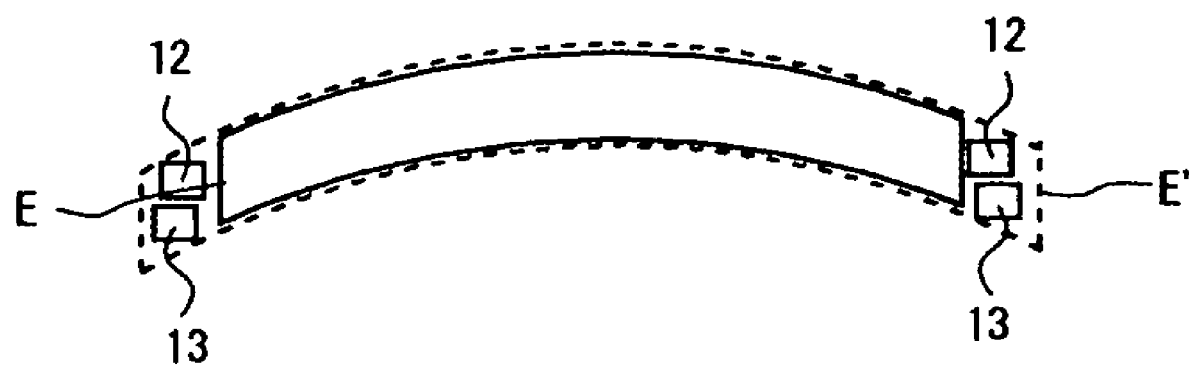
FIG. 7 is a drawing that shows an example in which a plurality of light quantity sensors 12, 13 have been provided.

In addition, only one each of light quantity sensors 12 and 13 are arranged in this projection exposure apparatus, but, for example, as shown in FIG. 7, a plurality each (two each in FIG. 7) may be arranged about the same light beam. If the output of a plurality of light quantity sensors arranged about same light beam were used, it would be possible to detect the quantity of light of that light beam with higher accuracy.

In addition, in this projection exposure apparatus, the effect of light returning to the projection optical system 6 after being reflected by the wafer 7 was ignored, but since the quantity of light of the light reflected by the wafer 7 is extremely small in EUVL, it is possible to perform adjustment with adequate accuracy even if this is ignored.

The second embodiment of the present invention will be explained below while referring to FIG. 8. Here, only the points of difference with the first embodiment will be explained.

Figure 8:
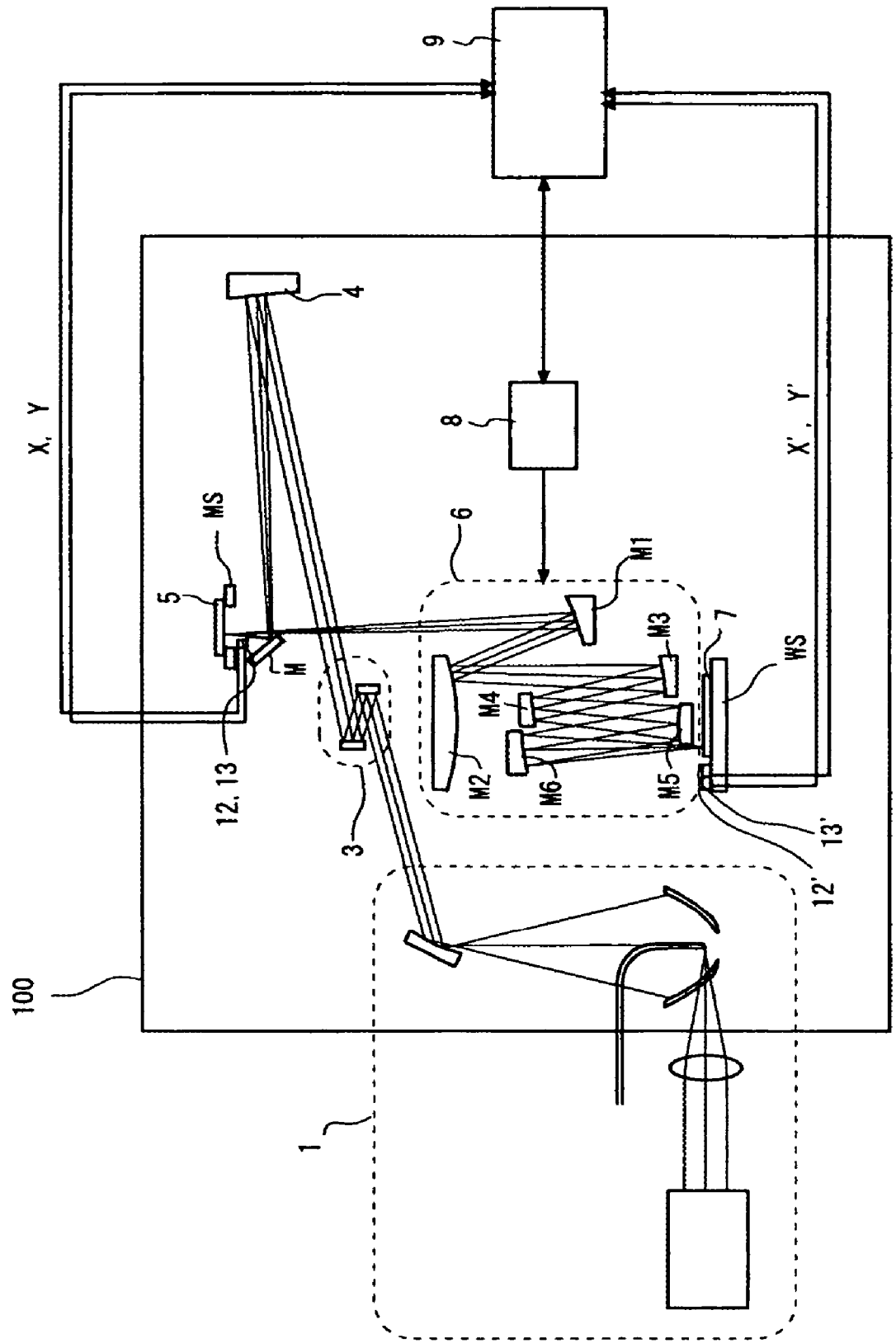
FIG. 8 is a schematic block diagram of a projection exposure apparatus of the second embodiment.

FIG. 8 is a schematic block diagram of this projection exposure apparatus. The main point of difference in terms of the configuration is that the same light quantity sensor 12' as light quantity sensor 12 and the same light quantity sensor 13' as light quantity sensor 13 are provided on the wafer stage WS. Below, these light quantity sensors 12', 13' are referred to as "wafer side sensors 12', 13'," and light quantity sensors 12 and 13 provided in the vicinity of the reticle 5 are referred to as "reticle side sensors 12, 13."

The controller 9 of this embodiment repeats a similar adjustment to that of the first embodiment, which used reticle side sensors 12 and 13, during the exposure period. In addition, the controller 9 of this embodiment corrects the heat absorption coefficients (E1, V1, E2, V2, E3, V3, E4, V4, E5, V5, E6 and V6) of the projection optical system 6 using the wafer side sensors 12' and 13' for each appropriate timing outside the exposure period.

This correction is performed to deal with changes over time in the reflection/absorption characteristics of the projection optical system 6. This is because there is a possibility that the respective reflectivities R1, R2, R3, R4, R5, R6 of the mirrors M1, M2, M3, M4, M5, M6 in the projection optical system 6 may drop over time due to contamination occurring inside the projection exposure apparatus. Moreover, the adherence of contaminants becomes more likely the further the mirror is on the upstream side, so changes over time are also marked.

Operation of the controller 9 relating to this correction will be explained in detail below.

In correction, the controller 9 drives the wafer stage WS, and wafer side sensors 12' and 13' are arranged on the optical path instead of the wafer 7. At this time, light (in-band light and out-band light) from the projection optical system 6 is incident to wafer side sensors 12' and 13'.

The controller 9 refers to the output X' of wafer side sensor 12' and the output Y' of wafer side sensor 13' at this time and respectively calculates quantity of light C' of the in-band light that exits from the projection optical system 6 and the quantity of light D' of the out-band light that exits from the projection optical system 6. The calculation method thereof is the same as the one with which quantities of light A and B were calculated in the first embodiment.

The controller 9 refers to the output X of reticle side sensor 12 and the output Y of reticle side sensor 13 at approximately the same timing as that with which outputs X' and Y' were referred to, and it respectively calculates quantity of light C of the in-band light that is incident to the projection optical system 6 and the quantity of light D of the out-band light that is incident to the projection optical system 6. The calculation method thereof is the same as explained in the first embodiment.

Moreover, the controller 9 determines whether or not there was fluctuation in the reflection/absorption characteristics of the projection optical system 6 with respect to in-band light based on quantity of light C' of the in-band light that exits from the projection optical system 6 and the quantity of light C of the in-band light that is incident to the projection optical system 6 (comparison with previous values), and in the case where there has been fluctuation, it corrects the values of the heat absorption coefficients (E1, E2, E3, E4, E5 and E6) relating to the in-band light. Here, the respective amounts of correction (ΔE1, ΔE2, ΔE3, ΔE4, ΔE5 and ΔE6) of the heat absorption coefficients (E1, E2, E3, E4, E5 and E6) may be determined based on only quantities of light C and C', but the method of a determination being made based not only on quantities of light C and C' but also on data obtained by advance measurements (for example, data of the curve for changes over time in the reflection/absorption characteristics of the respective mirrors M1, M2, M3, M4, M5, M6 with respect to the in-band light) is preferable in terms of performing correction with high accuracy. Note that the information required for this judgment and correction is stored in advance by the controller 9.

In addition, the controller 9 determines whether or not there was fluctuation in the reflection/absorption characteristics of the projection optical system 6 with respect to out-band light based on quantity of light D' of the out-band light that exits from the projection optical system 6 and the quantity of light D of the out-band light that is incident to the projection optical system 6 (comparison with previous values), and in the case where there has been fluctuation, it corrects the values of the heat absorption coefficients (V1, V2, V3, V4, V5 and V6) relating to the out-band light. Here, the respective amounts of correction (ΔV1, ΔV2, ΔV3, ΔV4, ΔV5 and ΔV6) of the heat absorption coefficients (V1, V2, V3, V4, V5 and V6) may be determined based on only quantities of light D and D'. However, the method of a determination based not only on quantities of light D and D' but also on data obtained by advance measurements (for example, data of the curve for changes over time in the reflection/absorption characteristics of the respective mirrors M1, M2, M3, M4, M5, M6 with respect to the out-band light) is preferable in terms of performing correction with high accuracy. Note that the information required for this judgment and correction is stored in advance by the controller 9.

Through the above correction, even if changes over time have occurred in the reflection/absorption characteristics of the projection optical system 6, the heat absorption coefficients (E1, V1, E2, V2, E3, V3, E4, V4, E5, V5, E6 and V6) would be updated to the correct values. As a result, the mirror adjustment system of this projection exposure apparatus would continue to operate correctly even if, for example, changes over time were to occur in the reflection/absorption characteristics of the projection optical system 6.

Moreover, the controller 9 of this embodiment independently corrects the heat absorption coefficients relating to in-band light (E1, E2, E3, E4, E5 and E6) and the heat absorption coefficients relating to out-band light (V1, V2, V3, V4, V5, and V6) based on four types of detected quantities of light (C, C', D, and D'), so the correction accuracy thereof is high.

Figure 9:
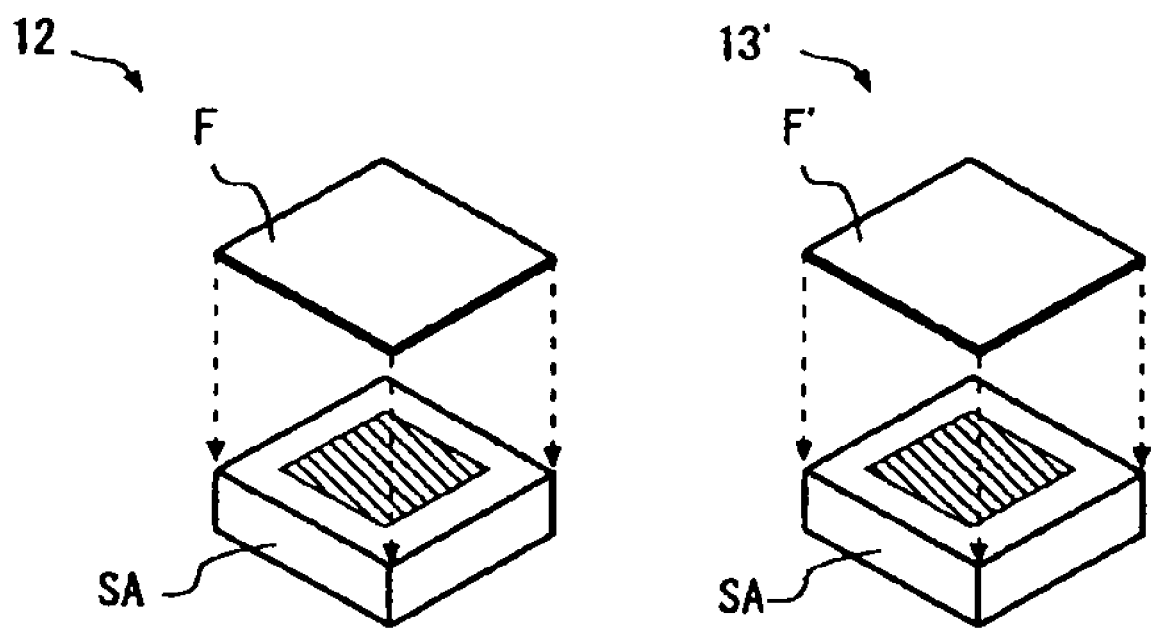
FIG. 9 is a drawing that explains a variation of the sensor part.
Figure 10:
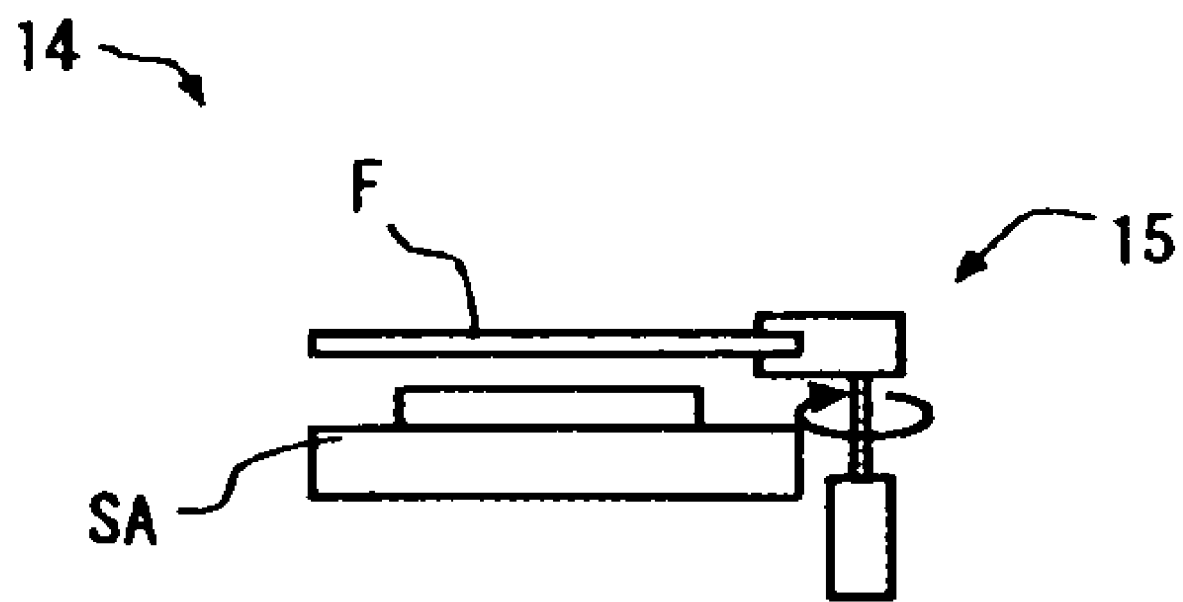
FIG. 10 is a drawing that explains another variation of the sensor part.
Figure 11:
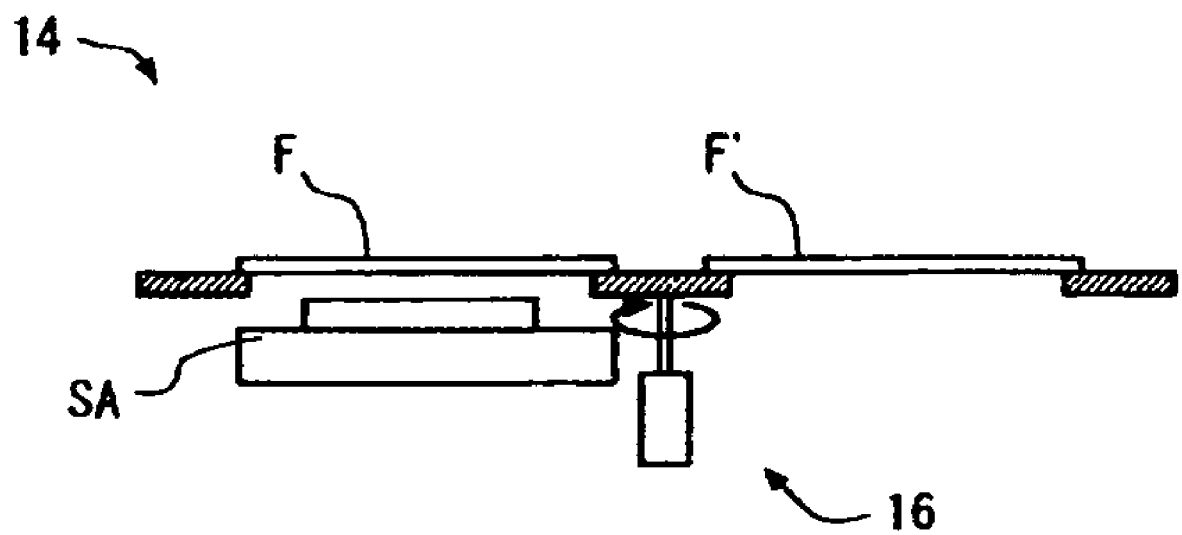
FIG. 11 is a drawing that explains yet another variation of the sensor part.

Note that the respective sensor parts of the aforementioned projection exposure apparatus comprise light quantity sensor 12, which detects the individual quantity of light of the in-band light, and light quantity sensor 13, which detects the quantity of light of the sum of the in-band light and the out-band light, but it is also possible to apply sensor parts such as those shown in any of FIG. 9, FIG. 10, and FIG. 11 as the sensor part for individually detecting the quantity of light of the in-band light and the quantity of light of the out-band light.

The sensor parts shown in FIG. 9 comprise a light quantity sensor 12, which results from providing a wavelength selection filter F that has transmittivity only with respect to in-band light on a photoelectric conversion element SA, and a light quantity sensor 13', which results from providing a wavelength selection filter F' that has transmittivity only with respect to out-band light on a photoelectric conversion element SA. The material of the wavelength selection filter F' is glass, for example.

The sensor part shown in FIG. 10 comprises a wavelength selection filter F that has transmittivity only with respect to in-band light or out-band light, one photoelectric conversion element SA, and a mechanism 15 that inserts and removes the wavelength selection filter F with respect to the front surface of the photoelectric conversion element SA.

The sensor part shown in FIG. 11 comprises a wavelength selection filter F that has transmittivity only with respect to in-band light, a wavelength selection filter F' that has transmittivity only with respect to out-band light, one photoelectric conversion element SA, and a mechanism 16 that switches the filter arranged on the front surface of the photoelectric conversion element SA between wavelength selection filters F and F'.

Note that, when the sensor part shown in FIG. 10 or FIG. 11 is used, the controller 9 drives mechanism 15 or mechanism 16 while referring to both the output X of the sensor part prior to driving and the output Y of the sensor part after driving.

The third embodiment of the present invention will be explained below while referring to FIG. 12 and FIG. 13. This embodiment is a variation of the first embodiment. Here, only the points of difference with the first embodiment will be explained.

The points of difference are that the subjects of adjustment for controlling fluctuation of image formation performance have been made the following respective subjects of adjustment.

The positions in directions (X axis directions) perpendicular to the respective optical axis directions of mirrors M1, M2, M3, M4, M5, and M6.

The positions in directions (Y axis directions) perpendicular to the respective optical axis directions and X axis directions of mirrors M1, M2, M3, M4, M5, and M6.

The positions in the respective optical axis directions (Z axis directions) of mirrors M1, M2, M3, M4, M5, and M6.

The arrangement angles about the respective X axes ($\theta_X$ axis directions) of mirrors M1, M2, M3, M4, M5, and M6.

The arrangement angles about the respective Y axes ($\theta_Y$ axis directions) of mirrors M1, M2, M3, M4, M5, and M6.

The arrangement angles about the respective Z axes ($\theta_Z$ axis directions) of mirrors M1, M2, M3, M4, M5, and M6.

The position of the wafer 7 in the X axis direction.
The position of the wafer 7 in the Y axis direction.
The position of the wafer 7 in the Z axis direction.

Figure 12:
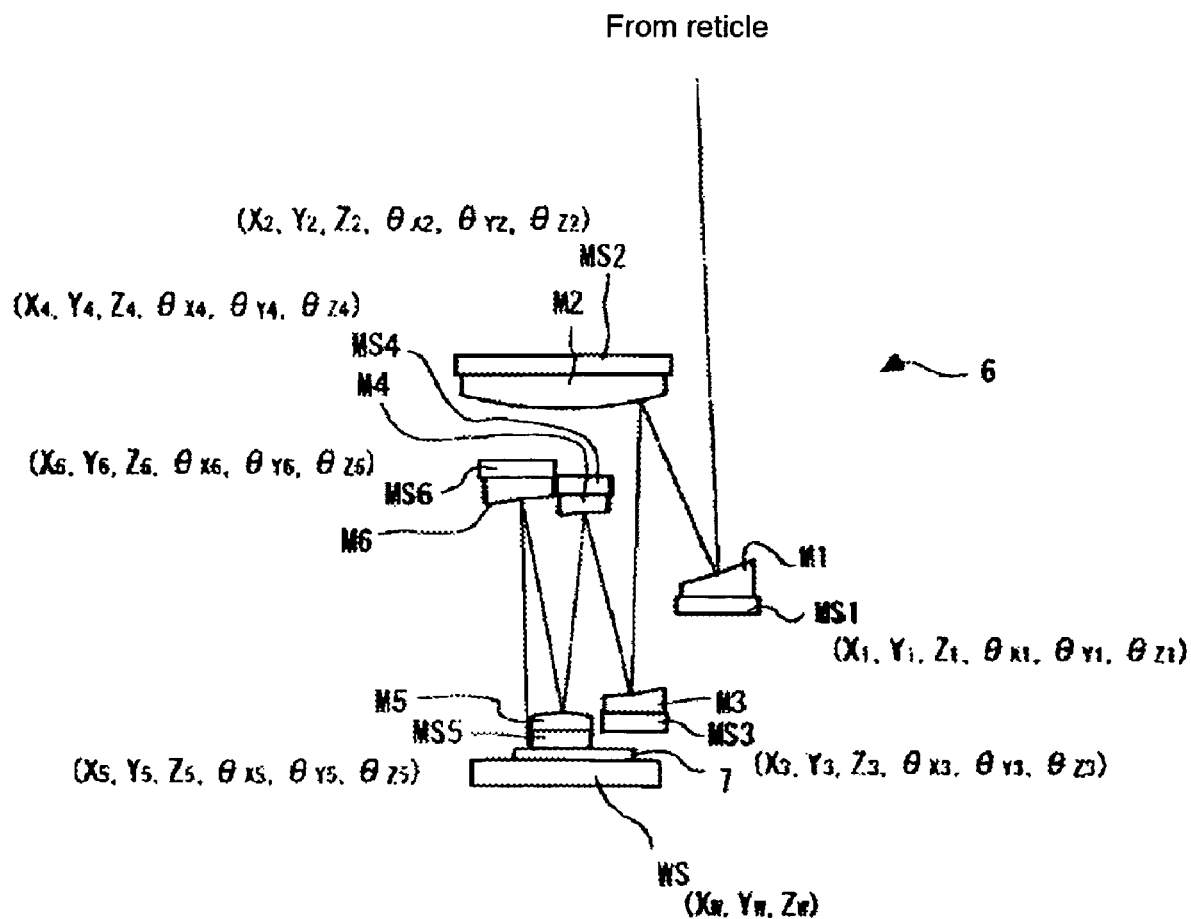
FIG. 12 is a drawing that explains the degrees of freedom of the stage of the third embodiment.

For this reason, in this embodiment, as shown in FIG. 12, the mirrors M1, M2, M3, M4, M5, M6 are respectively supported by mirror stages MS1, MS2, MS3, MS4, MS5, MS6 that have six degrees of freedom. Six degrees of freedom refers to the degree of freedom of the position in the X axis direction, the degree of freedom of the position of the Y axis direction, the degree of freedom of the position in the Z axis direction, the degree of freedom of the arrangement angle in the $\theta_X$ axis direction, the degree of freedom of the arrangement angle in the $\theta_Y$ axis direction, and the degree of freedom of the arrangement angle in the $\theta_Z$ axis direction.

The mirror stages MS1, MS2, MS3, MS4, MS5, MS6 correspond to the mirror adjustment mechanism 8 (see FIG. 1) of this embodiment. It is possible to respectively apply parallel link system stages, for example, to the mirror stages MS1, MS2, MS3, MS4, MS5, MS6.

On the other hand, the wafer stage WS that supports the wafer 7 should have at least three degrees of freedom in the same way as that of common projection exposure apparatuses. Three degrees of freedom refers to the degree of freedom of the position in the X axis direction, the degree of freedom of the position of the Y axis direction, and the degree of freedom of the position in the Z axis direction.

Below, the amount of adjustment of a mirror M1 by a mirror stage MSi in the X axis direction is $X_i$, the amount of adjustment of a mirror Mi by a mirror stage MSi in the Y axis direction is $Y_i$, the amount of adjustment of a mirror Mi by a mirror stage MSi in the Z axis direction is $Z_i$, the amount of adjustment of a mirror Mi by a mirror stage MSi in the $\theta_X$ axis direction is $\theta_{Xi}$, the amount of adjustment of a mirror Mi by a mirror stage MSi in the $\theta_Y$ axis direction is $\theta_{Yi}$, the amount of adjustment of a mirror Mi by a mirror stage MSi in the $\theta_Z$ axis direction is $\theta_{Zi}$, the amount of adjustment of the wafer 7 by the wafer stage WS in the X axis direction is $X_W$, the amount of adjustment of the wafer 7 by the wafer stage WS in the Y axis direction is $Y_W$, and the amount of adjustment of the wafer 7 by the wafer stage WS in the Z axis direction is $Z_W$.

In this way, if amounts of adjustment $X_1, Y_1, Z_1, \theta_{X1}, \theta_{Y1}, \theta_{Z1}, X_2, Y_2, Z_2, \theta_{X2}, \theta_{Y2}, \theta_{Z2}, \ldots, X_6, Y_6, Z_6, \theta_{X6}, \theta_{Y6}, \theta_{Z6}$ in the directions of the six axes of the respective mirrors are used, even in the case where, provisionally, fluctuation of the image formation characteristics of the projection optical system 6 is complex, it is thought that it would be possible to reliably control this. As discussed above, since the projection optical system 6 is a reflection type and is an off-axis optical system, the deformation generated in a mirror Mi is not necessarily rotationally symmetric and may be non-rotationally symmetric with respect to fluctuation occurring in the image formation characteristics, so such control is extremely effective.

However, when control of fluctuation of image formation characteristics is made to cover only amounts of adjustment $X_i, Y_i, Z_i, \theta_{Xi}, \theta_{Yi},$ and $\theta_{Zi}$ of the respective mirrors, there is a possibility of the calculations for determining those amounts of adjustment becoming complicated.

Therefore, in this embodiment, amounts of adjustment $X_W, Y_W,$ and $Z_W$ of the wafer 7 are combined with amounts of adjustment $X_i, Y_i, Z_i, \theta_{Xi}, \theta_{Yi},$ and $\theta_{Zi}$ of the respective mirrors.

Incidentally, the amounts of adjustment above are respectively determined by the controller 9 in the same way as in the first embodiment. The timing at which that determination is performed is step S3 of FIG. 4 in the same way as in the first embodiment.

Figure 13A:
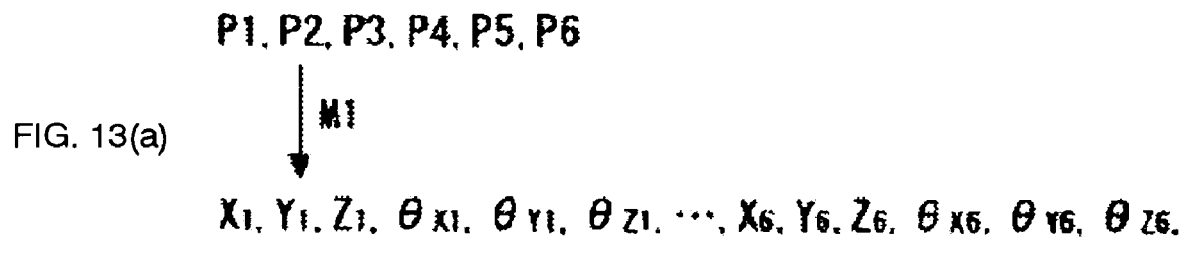
FIG. 13(a) and FIG. 13(b) are drawings that explain the method of determining the amount of adjustment of the third embodiment.
Figure 13B:
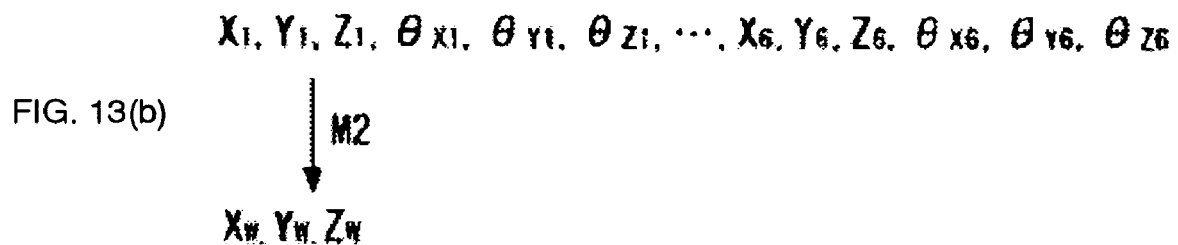

FIGS. 13(a) and 13(b) are drawings that explain the determination method of this embodiment.

First, as shown in FIG. 13(a), the amounts of adjustment $X_1, Y_1, Z_1, \theta_{X1}, \theta_{Y1}, \theta_{Z1}, X_2, Y_2, Z_2, \theta_{X2}, \theta_{Y2}, \theta_{Z2}, \ldots, X_6, Y_6, Z_6, \theta_{X6}, \theta_{Y6}, \theta_{Z6}$ of the respective mirrors are determined, then, as shown in FIG. 13(b), amounts of adjustment $X_W, Y_W$ and $Z_W$ of the wafer are determined.

The amounts of adjustment $X_1, Y_1, Z_1, \theta_{X1}, \theta_{Y1}, \theta_{Z1}, X_2, Y_2, Z_2, \theta_{X2}, \theta_{Y2}, \theta_{Z2}, \ldots X_6, Y_6, Z_6, \theta_{X6}, \theta_{Y6}, \theta_{Z6}$ of the respective mirrors are determined based on the deformation rates P1, P2, P3, P4, P5, P6 of the respective mirrors in the same way as when amounts of adjustment $Z_1, Z_2, Z_3, Z_4, Z_5,$ and $Z_6$ were determined in the first embodiment.

Here, as in Equation (5) below, deformation rates P1, P2, P3, P4, P5, P6 of the respective mirrors are put together to make deformation rate vector P.

Equation 5

$$P = \begin{bmatrix} P1 \\ P2 \\ P3 \\ P4 \\ P5 \\ P6 \end{bmatrix} \quad (5)$$

In addition, as in Equation (6) below, the amounts of adjustment $X_1, Y_1, Z_1, \theta_{X1}, \theta_{Y1}, \theta_{Z1}, X_2, Y_2, Z_2, \theta_{X2}, \theta_{Y2}, \theta_{Z2}, \ldots, X_6, Y_6, Z_6, \theta_{X6}, \theta_{Y6}, \theta_{Z6}$ of the respective mirrors are put together to make adjustment amount vector D.

Equation 6

$$D = \begin{bmatrix} X_1 \\ Y_1 \\ Z_1 \\ \theta_{X1} \\ \theta_{Y1} \\ \theta_{Z1} \\ \vdots \\ X_6 \\ Y_6 \\ Z_6 \\ \theta_{X6} \\ \theta_{Y6} \\ \theta_{Z6} \end{bmatrix} \tag{6}$$

At this time, the amounts of adjustment $X_1, Y_1, Z_1, \theta_{X1}, \theta_{Y1}, \theta_{Z1}, X_2, Y_2, Z_2, \theta_{X2}, \theta_{Y2}, \theta_{Z2}, \ldots, X_6, Y_6, Z_6, \theta_{X6}, \theta_{Y6}, \theta_{Z6}$ of the respective mirrors are uniquely determined by means of Equation (7) below.

Equation 7

$$D = M_1 P \tag{7}$$

Where, $M_1$ in Equation (7) indicates a matrix of 36 rows and 6 columns. This matrix $M_1$ is as shown in Equation (8).

Equation 8

$$M_1 = \begin{bmatrix} m_{11} & m_{12} & m_{13} & m_{14} & m_{15} & m_{16} \\ m_{21} & m_{22} & m_{23} & m_{24} & m_{25} & m_{26} \\ m_{31} & m_{32} & m_{33} & m_{34} & m_{35} & m_{36} \\ m_{41} & m_{42} & m_{43} & m_{44} & m_{45} & m_{46} \\ \vdots & \vdots & \vdots & \vdots & \vdots & \vdots \\ m_{361} & m_{362} & m_{363} & m_{364} & m_{365} & m_{366} \end{bmatrix} \tag{8}$$

The values of the respective elements $m_{kl}$ of this matrix $M_1$ are calculated by optical calculation based on the design data of the projection optical system 6, and the controller 9 stores them in advance. This matrix $M_1$ is a conversion matrix that converts deformation rate vector P into the adjustment amount vector D required to control fluctuation of image formation characteristics.

For example, the first column vector "$m_{11}, M_{21}, \ldots m_{361}$" that forms matrix $M_1$ corresponds to the adjustment amount vector D required to gradually control fluctuation of image formation characteristics generated when the deformation rate P1 of mirror M1 is 1 using the 36 types of amounts of adjustment of the six mirrors.

In addition, the second column vector "$m_{12}, m_{22}, m_{362}$" that forms matrix $M_1$ corresponds to the adjustment amount vector D required to gradually control fluctuation of image formation characteristics generated when the deformation rate P2 of mirror M2 is 1 using the 36 types of amounts of adjustment of the six mirrors.

In addition, the third column vector "$m_{13}, m_{23}, \ldots m_{363}$" that forms matrix $M_1$ corresponds to the adjustment amount vector D required to gradually control fluctuation of image formation characteristics generated when the deformation rate P3 of mirror M3 is 1 using the 36 types of amounts of adjustment of the six mirrors.

In addition, the fourth column vector "$m_{14}, m_{24}, \ldots m_{364}$" that forms matrix $M_1$ corresponds to the adjustment amount vector D required to gradually control fluctuation of image formation characteristics generated when the deformation rate P4 of mirror M4 is 1 using the 36 types of amounts of adjustment of the six mirrors.

In addition, the fifth column vector "$m_{15}, m_{25}, \ldots m_{365}$" that forms matrix $M_1$ corresponds to the adjustment amount vector D required to gradually control fluctuation of image formation characteristics generated when the deformation rate P5 of mirror M5 is 1 using the 36 types of amounts of adjustment of the six mirrors.

In addition, the sixth column vector "$m_{16}, m_{26}, \ldots m_{366}$" that forms matrix $M_1$ corresponds to the adjustment amount vector D required to gradually control fluctuation of image formation characteristics generated when the deformation rate P6 of mirror M6 is 1 using the 36 types of amounts of adjustment of the six mirrors.

However, the values of the respective elements $m_{kl}$ of this matrix $M_1$ are set so that the image shift components, from among the fluctuation in image formation characteristics, are excluded from being subject to control. The image shift components are the image shift component in the X axis direction, the image shift component in the Y axis direction, and the image shift component in the Z axis direction. That is, the subjects of control of the matrix M1 are limited to the main components other than the image shift components, from among the fluctuation of image formation characteristics.

In addition, the values of the respective elements $m_{kl}$ of this matrix $M_1$ are set in advance so that the respective amounts of adjustment of the respective mirrors are collected within the allowable range (stroke determined in advance).

When the above matrix $M_1$ is used to determine the amounts of adjustment $X_1, Y_1, Z_1, \theta_{X1}, \theta_{Y1}, \theta_{Z1}, X_2, Y_2, Z_2, \theta_{X2}, \theta_{Y2}, \theta_{Z2}, \ldots, X_6, Y_6, Z_6, \theta_{X6}, \theta_{Y6}, \theta_{z6}$ of the respective mirrors, the controller 9 determines amounts of adjustment $X_W, Y_W$ and $Z_W$ of the wafer based on the respective determined amounts of adjustment $X_1, Y_1, Z_1, \theta_{X1}, \theta_{Y1}, \theta_{Z1}, X_2, Y_2, Z_2, \theta_{X2}, \theta_{Y2}, \theta_{Z2}, \ldots, X_6, Y_6, Z_6, \theta_{X6}, \theta_{Y6}, \theta_{Z6}$.

When amounts of adjustment $X_W, Y_W$, and $Z_W$ of the wafer are put together to make adjustment amount vector $D_w$, amounts of adjustment $X_W, Y_W$, and $Z_W$ are uniquely determined using Equation (9) below.

Equation 9

$$D_w = M_2 D \tag{9}$$

However, what is indicated by $M_2$ in Equation (9) is a matrix of 3 rows and 36 columns. The values of the respective elements of this matrix $M_2$ are calculated by optical calculation based on the design data of the projection optical system 6, and the controller 9 stores them in advance. This matrix $M_2$ is a conversion matrix that converts adjustment amount vector D into the adjustment amount vector $D_w$ required to control the image shift components of the fluctuation of image formation characteristics.

Above, when the values of amounts of adjustment $X_1, Y_1, Z_1, \theta_{X1}, \theta_{Y1}, \theta_{Z1}, X_2, Y_2, Z_2, \theta_{X2}, \theta_{Y2}, \theta_{Z2}, \ldots, X_6, Y_6, Z_6, \theta_{X6}, \theta_{Y6}, \theta_{Z6}$ of the respective mirrors and the values of amounts of adjustment $X_W, Y_W$ and $Z_W$ of the wafer are determined, actual adjustment is performed at a similar timing to that of step S4 of FIG. 4.

In this adjustment, the values of determined amounts of adjustment $X_1, Y_1, Z_1, \theta_{X1}, \theta_{Y1}$ and $\theta_{Z1}$ and the adjustment instruction are provided to mirror stage MS1. In addition, the values of determined amounts of adjustment $X_2, Y_2, Z_2, \theta_{X2}, \theta_{Y2}$, and $\theta_{Z2}$ and the adjustment instruction are provided to mirror stage MS2. In addition, the values of determined amounts of adjustment $X_3, Y_3, Z_3, \theta_{X3}, \theta_{Y3}$, and $\theta_{Z3}$ and the adjustment instruction are provided to mirror stage MS3. In addition, the values of determined amounts of adjustment $X_4, Y_4, Z_4, \theta_{X4}, \theta_{Y4}$, and $\theta_{Z4}$ and the adjustment instruction are provided to mirror stage MS4. In addition, the values of determined amounts of adjustment $X_5, Y_5, Z_5, \theta_{X5}, \theta_{Y5}$, and $\theta_{Z5}$ and the adjustment instruction are provided to mirror stage MS5. In addition, the values of determined amounts of adjustment $X_6, Y_6, Z_6, \theta_{X6}, \theta_{Y6}$, and $\theta_{Z6}$ and the adjustment instruction are provided to mirror stage MS6. In addition, the values of determined amounts of adjustment $X_W, Y_W$, and $Z_W$ and the adjustment instruction are provided to the wafer stage WS.

As a result, the mirror stages MS1, MS2, MS3, MS4, MS5, MS6 work in the direction of controlling the main components of the fluctuation of the image formation characteristics of the projection optical system 6, and the wafer stage WS works in the direction of controlling the image shift components of that fluctuation.

Therefore, through this embodiment, even if complex fluctuation were produced in the image formation characteristics of the projection optical system 6, it would be possible to reliably control it. In addition, in this embodiment, though there are many types of adjustment amounts (39 types), matrices ($M_1$, $M_2$) that have been determined in advance are used in the calculation for determining the respective amounts of adjustment, so that determination is performed at high speed. For example, the processing of one loop shown in FIG. 4 (one adjustment) is executed at a frequency of one time per shot during operation of the projection exposure apparatus or at a frequency of one time per 2~3 seconds, and it is also possible to follow fluctuations of image formation characteristics.

Note that the contents of the matrices $M_1$, $M_2$ required in Equations (7) and (9) differ according to the exposure conditions of the projection exposure apparatus (the illumination conditions, NA of the projection optical system, etc.) and the type of reticle 5. For this reason, it is preferable that the controller 9 store a plurality of types of matrices in advance in addition to being able to appropriately use a plurality of types of matrices according to a combination of the exposure conditions and the type of reticle 5.

In addition, in this embodiment, adjustment by a mirror stage MSi and adjustment by the wafer stage WS were performed at the same timing at the same frequency, but it is permissible for the timing and the frequency of the two not to match. For example, the frequency of adjustment by a mirror stage MSi may be set to a high frequency (continuous), and the frequency of adjustment by the wafer stage WS may be set to a frequency of one time per shot.

In addition, in this embodiment, six degrees of freedom were respectively provided to the mirror stages MS1, MS2, MS3, MS4, MS5, MS6, but in the case where the required accuracy with respect to control of fluctuation of image formation characteristics is low, the degree of freedom of some of the mirror stages or all of the mirror stages may be lowered to any of five degrees of freedom, four degrees of freedom, three degrees of freedom, or two degrees of freedom. For example, in the case of lowering to five degrees of freedom, the degree of freedom in the $\theta_Z$ axis direction may be eliminated. In addition, in the case of lowering to three degrees of freedom, the degrees of freedom in the $\theta_Z$ axis direction, the $\theta_X$ axis direction and the $\theta_Y$ axis direction may be eliminated.

In addition, in this embodiment, the wafer stage WS was used for control of fluctuation of image formation characteristics, but a reticle stage MS may be used instead of a wafer stage WS. In addition, both a wafer stage WS and a reticle stage MS may be used. This is because, if the reticle 5 and the wafer 7 are moved relatively, a similar effect to that when only the wafer 7 was moved can be obtained.

In addition, in this embodiment, six mirror stages MS1, MS2, MS3, MS4, MS5, MS6 were allocated to control of the main components of fluctuation of image formation characteristics, and the wafer stage WS (and/or a reticle stage MS) was allocated to control the image shift components of that fluctuation, but the method of allocation of the respective components is not limited to this. Some of the main components may also be assigned to the wafer stage WS (and/or the reticle stage MS). However, in that case it is preferable that the degrees of freedom of the attitude (degree of freedom of the arrangement angle in the $\theta_X$ axis direction, degree of freedom of the arrangement angle in the $\theta_Y$ axis direction, degree of freedom of the arrangement angle in the $\theta_Z$ axis direction, etc.) be assigned to that stage.

In addition, this embodiment was a variation of the first embodiment, but it is also possible to vary the second embodiment in the same way.

The fourth embodiment of the present invention will be explained below while referring to FIG. 14(*a*) and FIG. 14(*b*). This embodiment is a variation of the first embodiment. Here, only the points of difference with the first embodiment will be explained.

The points of difference lie in the method of calculating the amount of heat absorption in step S3 of FIG. 4.

In the first embodiment, the effects of light returning to the projection optical system 6 after being reflected by the wafer 7 (returning light) were ignored, but, in actuality, even though the wafer 7 for EUVL does not reflect in-band light, it reflects out-band light, and there is a possibility of generating returning light (returning light consisting of out-band light). This is taken into account in the calculation method of this embodiment.

Figure 14A:
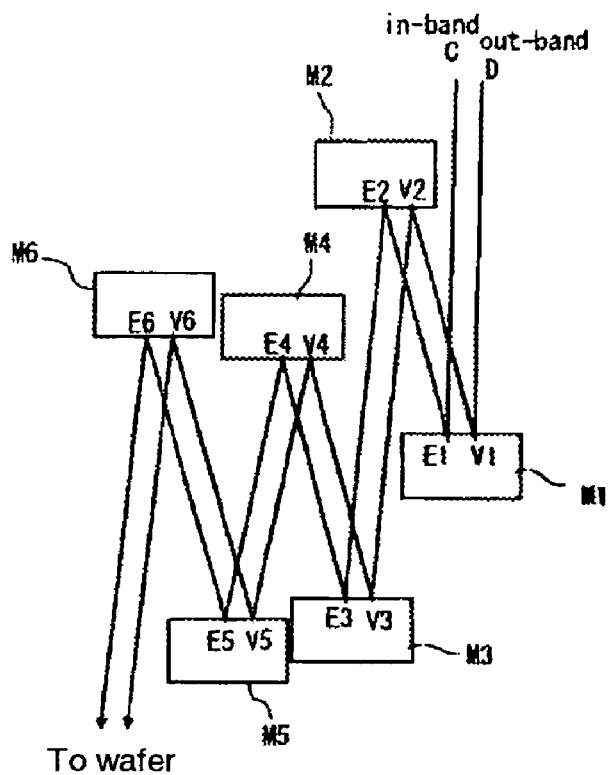
FIG. 14(a) and FIG. 14(b) are drawings that explain the method of calculating the amount of heat absorption of the fourth embodiment.
Figure 14B:
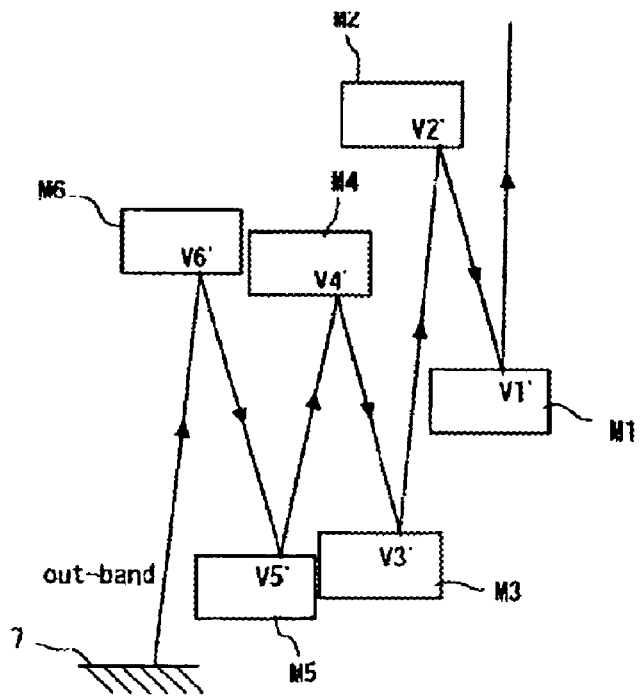

FIG. 14(*a*) and FIG. 14(*b*) are drawings that explain a calculation method of this embodiment. FIG. 14(A) shows the in-band light and the out-band light incident from the reticle side to the projection optical system 6, and FIG. 14(B) shows the out-band light that returns from the wafer side to the projection optical system 6.

Here, the heat absorption coefficient of a mirror Mi with respect to in-band light is Ei. This heat absorption coefficient Ei is the same as that explained in the first embodiment.

In addition the heat absorption coefficients of a mirror Mi with respect to out-band light are Vi and Vi'. Heat absorption coefficient Vi relates to the out-band light that goes toward the wafer (FIG. 14(A)), and heat absorption coefficient Vi' relates to the out-band light that returns from the wafer (FIG. 14(B)).

Specifically, heat absorption coefficient Vi (FIG. 14(A)) is the amount of heat absorbed by a mirror Mi (amount of heat absorption) caused by the out-band light going toward the wafer when the quantity of light of the out-band light that is incident to the projection optical system 6 was "1."

On the other hand, heat absorption coefficient Vi' (FIG. 14(B)) is the amount of heat absorbed by a mirror Mi (amount of heat absorption) caused by the out-band light returning from the wafer when the quantity of light of the out-band light that is incident to the projection optical system 6 was "1."

Therefore, the controller 9 of this embodiment estimates the amount of heat absorption Wi of a mirror Mi by applying quantity of light C of the in-band light that is incident to the projection optical system 6 and quantity of light D of the out-band light that is incident to the projection optical system 6 to Equation (10) below.

Equation 10

$$W_i = [C \quad D] \cdot \begin{bmatrix} E_i \\ V_i + V_i' \end{bmatrix} \quad (10)$$

Note that the information required for this estimation, that is, "E1," "E2," "E3," "E4," "E5," "E6," "V1+V1'," "V2+V2'," "V3+V3'," "V4+V4'," "V5+V5'," and "V6+V6'," is stored in advance by the controller 9.

Of these, the value of heat absorption coefficient Ei is, as explained in the first embodiment, determined according to the reflectivity of a mirror Mi and mirrors further on the upstream side thereof with respect to in-band light, and the value of heat absorption coefficient Vi is, as explained in the first embodiment, determined according to the reflectivity of a mirror Mi and mirrors further on the upstream side thereof with respect to out-band light.

On the other hand, the value of heat absorption coefficient Vi' is determined according to both the reflectivity of a mirror Mi and all mirrors with respect to out-band light and the reflectivity of the wafer 7 with respect to out-band light. A specific explanation is given below.

In the explanation, for simplicity, the reflectivity of mirrors M1, M2, M3, M4, M5 and M6 with respect to in-band light is uniformly $a_{in}$, and the reflectivity of mirrors M1, M2, M3, M4, M5 and M6 with respect to out-band light is uniformly $a_{out}$. In addition, the reflectivity of the wafer 7 with respect to out-band light is b.

At this time, heat absorption coefficients E1, E2, E3, E4, E5 and E6 are expressed as follows (also the same in the first embodiment).

$E1 = 1 - a_{in}$
$E2 = a_{in} \times (1 - a_{in})$
$E3 = a_{in}^2 \times (1 - a_{in})$
$E4 = a_{in}^3 \times (1 - a_{in})$
$E5 = a_{in}^4 \times (1 - a_{in})$
$E6 = a_{in}^5 \times (1 - a_{in})$ In addition, heat absorption coefficients V1, V2, V3, V4, V5 and V6 are expressed as follows (also the same in the first embodiment).

$V1 = 1 - a_{out}$
$V2 = a_{out} \times (1 - a_{out})$
$V3 = a_{out}^2 \times (1 - a_{out})$
$V4 = a_{out}^3 \times (1 - a_{out})$
$V5 = a_{out}^4 \times (1 - a_{out})$
$V6 = a_{out}^5 \times (1 - a_{out})$ Also, heat absorption coefficients V6', V5', V4', V3', V2', and V1' are expressed as follows using the reflectivity b of the wafer.

$V6' = a_{out}^6 \times b \times (1 - a_{out})$
$V5' = a_{out}^7 \times b \times (1 - a_{out})$
$V4' = a_{out}^8 \times b \times (1 - a_{out})$
$V3' = a_{out}^9 \times b \times (1 - a_{out})$
$V2' = a_{out}^{10} \times b \times (1 - a_{out})$
$V1' = a_{out}^{11} \times b \times (1 - a_{out})$ Therefore, in this embodiment, in the heat absorption amount calculation equation (10), not only are the value of the reflectivity of the mirrors with respect to in-band light $a_{in}$ and the value of the reflectivity of the mirrors with respect to out-band light $a_{out}$ considered, but even up to the value of the reflectivity b of the wafer 7 with respect to out-band light is considered. Therefore, through this embodiment, it is possible to control fluctuations in the image formation characteristics with higher accuracy.

Note that, though the value of the reflectivity b of the wafer 7 is considered not to change over time, it varies according to the type of wafer 7. For this reason, it is preferable that the controller 9 hold the value of "b" in the calculation equation as a variable value (parameter). For this reason, it is preferable that, for example, a user interface function that causes user input of the value of the reflectivity b be built into the projection exposure apparatus of this embodiment. In addition, a reflectivity sensor that measures the reflectivity b from the wafer 7 may be built in instead of that function. The reflectivity sensor comprises, for example, a light projection part, which projects out-band light to a portion of the wafer 7, and a light receiving part, which detects the quantity of light of the reflected light thereof. Moreover, if the average value of the reflectivity b (for example, 0.7) is stored in advance in the controller 9 as a default value, it would also be possible to save the labor of user input and measurement.

In addition, this embodiment was a variation of the first embodiment, but it is also possible to similarly vary the second embodiment or the third embodiment.

Through the present invention, an exposure apparatus for EUVL that is able to accurately ascertain fluctuations of the characteristics of the projection optical system resulting from the irradiation heat of light is realized.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A photolithography exposure apparatus for exposing an object, the exposure apparatus comprising:
   a light source for emitting a beam of light having an exposure wavelength component and a non-exposure wavelength component;
   a first light quantity sensor for detecting the quantity of the exposure wavelength component of the beam of light; and
   a second light quantity sensor for detecting the quantity of the non-exposure wavelength component of the beam of light,
   wherein the first light quantity sensor and the second light quantity sensor detect the quantities of light simultaneously,
   the first light quantity sensor comprises an exposure wavelength sensor for detecting the quantity of light of the exposure wavelength component, and
   the second light quantity sensor comprises a non-exposure wavelength sensor for detecting the quantity of light of the non-exposure wavelength component.

2. An exposure apparatus according to claim 1, further comprising:
   a projection optical system arranged between the light source and the object; and
   an adjustment system for adjusting the projection optical system based on output of the first and second light quantity sensors.

3. An exposure apparatus according to claim 2, wherein the projection optical system includes at least one mirror, and
   the adjustment system adjusts at least the position of the mirror in a direction perpendicular to an optical axis of the exposure apparatus.

4. An exposure apparatus according to claim 2, wherein
the projection optical system includes at least one mirror, and
the adjustment system adjusts at least the attitude of the mirror.

5. An exposure apparatus according to claim 2, wherein
the projection optical system projects a pattern of a mask to the object, and
the adjustment system adjusts at least the relative position of the mask and the object.

6. An exposure apparatus according to claim 2, wherein
the projection optical system projects a pattern of a mask to the object, and
the adjustment system adjusts at least the attitude of at least one of the mask and the object.

7. An exposure apparatus according to claim 2, wherein
the adjustment system adjusts the projection optical system based on the detected quantity of light of the exposure wavelength component, the detected quantity of light of the non-exposure wavelength component, image formation characteristics of the projection optical system with respect to the exposure wavelength component, and image formation characteristics of the projection optical system with respect to the non-exposure wavelength component.

8. An exposure apparatus according to claim 7, further comprising:
a third light quantity sensor for detecting the quantity of the exposure wavelength component of the beam of light; and
a fourth light quantity sensor for detecting the quantity of the non-exposure wavelength component of the beam of light,
wherein the first and second light quantity sensors are positioned to detect light which has not yet passed through the projection optical system,
the third and fourth light quantity sensors are positioned to detect light that has passed through the projection optical system, and
the adjustment system:
adjusts the projection optical system with respect to the exposure wavelength component based on the quantity of light of the exposure wavelength component detected by the first light quantity sensor, the quantity of light of the exposure wavelength component detected by the third light quantity sensor, and the image formation characteristics of the projection optical system with respect to the exposure wavelength component; and
adjusts the projection optical system with respect to the non-exposure wavelength component based on the quantity of light of the non-exposure wavelength component detected by the second light quantity sensor, the quantity of light of the non-exposure wavelength component detected by the fourth light quantity sensor, and the image formation characteristics of the projection optical system with respect to the non-exposure wavelength component.

9. An exposure apparatus according to claim 7, wherein the image formation characteristics of the projection optical system include respective absorption coefficients of optical members within the projection optical system.

10. An exposure apparatus according to claim 7, wherein
the adjustment system adjusts the projection optical system based further on the reflectivity of the object with respect to the non-exposure wavelength component.

11. An exposure apparatus according to claim 1, further comprising a reflectivity detector that detects the reflectivity of the object with respect to the non-exposure wavelength component.

12. An exposure apparatus according to claim 1, wherein the light source is an EUV light source.

13. A photolithography exposure apparatus for exposing an object, the exposure apparatus comprising:
a light source for emitting a beam of light having an exposure wavelength component and having a non-exposure wavelength component;
first and second light quantity sensors for respectively detecting the quantity of the non-exposure wavelength component and the quantity of the exposure wavelength component of the beam of light; and
third and fourth light quantity sensors, downstream of the first and second light quantity sensors with respect to an optical axis of the apparatus, for respectively detecting the quantity of the non-exposure wavelength and the quantity of the exposure wavelength of the beam of light,
wherein the first and second light quantity sensors detect the quantities of light simultaneously and the third and fourth light quantity sensors detect the quantities of light simultaneously.

14. A photolithography exposure method of a photolithography exposure apparatus for exposing an object, the method comprising the steps of:
emitting a beam of light having an exposure wavelength component and having a non-exposure wavelength component;
detecting, by a first light quantity sensor, the quantity of the non-exposure wavelength component of the beam of light; and
detecting, by a second light quantity sensor, the quantity of the exposure wavelength component of the beam of light;
detecting, by a third light quantity sensor downstream of the first light quantity sensor with respect to an optical axis of the photolithography exposure apparatus, the quantity of the non-exposure wavelength component of the beam of light; and
detecting, by a fourth light quantity sensor downstream of the second light quantity sensor with respect to the optical axis of the photolithography exposure apparatus, the quantity of the exposure wavelength component of the beam of light,
wherein the first light quantity sensor and the second light quantity sensor detect the quantities of light simultaneously and the third and fourth light quantity sensors detect the quantities of light simultaneously.

15. A photolithography exposure apparatus for exposing an object, the exposure apparatus comprising:
a light source for emitting a beam of light having an exposure wavelength component and a non-exposure wavelength component;
a first light quantity sensor for detecting the quantity of the exposure wavelength component of the beam of light; and
a second light quantity sensor for detecting the quantity of the non-exposure wavelength component of the beam of light, wherein the first light quantity sensor and the second light quantity sensor detect the quantities of light simultaneously;
a third light quantity sensor for detecting the quantity of the exposure wavelength component of the beam of light; and a fourth light quantity sensor for detecting the quantity of the non-exposure wavelength component of the beam of light;

a projection optical system arranged between the light source and the object; and an adjustment system for:

adjusting the projection optical system with respect to the exposure wavelength component based on the quantity of the exposure wavelength component detected by the first light quantity sensor, the quantity of the exposure wavelength component detected by the third light quantity sensor, and image formation characteristics of the projection optical system with respect to the exposure wavelength component; and adjusting the projection optical system with respect to the non-exposure wavelength component based on the quantity of the non-exposure wavelength component detected by the second light quantity sensor, the quantity of the non-exposure wavelength component detected by the fourth light quantity sensor, and image formation characteristics of the projection optical system with respect to the non-exposure wavelength component, wherein the first and second light quantity sensors are positioned to detect light that has not yet passed through the projection optical system, and the third and fourth light quantity sensors are positioned to detect light that has passed through the projection optical system.

16. A photolithography exposure apparatus for exposing an object, the exposure apparatus comprising:

a light source for emitting a beam of light having an exposure wavelength component and a non-exposure wavelength component;

a first light quantity sensor for detecting the quantity of the exposure wavelength component of the beam of light; and a second light quantity sensor for detecting the quantity of the non-exposure wavelength component of the beam of light, wherein the first light quantity sensor comprises a sensor for sensing only specific wavelengths of the beam of light corresponding to the exposure wavelength component, the second light quantity sensor comprises a sensor for sensing all other wavelengths of the beam of light to detect the quantity of light of the non-exposure wavelength component, and the first light quantity sensor and the second light quantity sensor detect the quantities of light simultaneously.

* * * * *